United States Patent
Kakimoto et al.

(10) Patent No.: US 8,945,339 B2
(45) Date of Patent: *Feb. 3, 2015

(54) FILM FORMATION APPARATUS

(75) Inventors: Akinobu Kakimoto, Nirasaki (JP);
Katsuhiko Komori, Nirasaki (JP);
Kazuhide Hasebe, Nirasaki (JP)

(73) Assignee: Tokyo Electron Limited (JP)

( * ) Notice: Subject to any disclaimer, the term of this patent is extended or adjusted under 35 U.S.C. 154(b) by 565 days.

This patent is subject to a terminal disclaimer.

(21) Appl. No.: 13/283,869

(22) Filed: Oct. 28, 2011

(65) Prior Publication Data

US 2012/0103518 A1 May 3, 2012

(30) Foreign Application Priority Data

Oct. 29, 2010 (JP) ................... 2010-243130
Sep. 22, 2011 (JP) ................... 2011-207962

(51) Int. Cl.
| | | |
|---|---|---|
| C23C 16/52 | (2006.01) | |
| C23C 16/455 | (2006.01) | |
| C23C 16/22 | (2006.01) | |
| H01L 21/306 | (2006.01) | |
| C23F 1/00 | (2006.01) | |
| H01L 21/02 | (2006.01) | |
| C23C 16/02 | (2006.01) | |
| C23C 16/04 | (2006.01) | |
| C23C 16/24 | (2006.01) | |

(Continued)

(52) U.S. Cl.
CPC ...... *H01L 21/02057* (2013.01); *C23C 16/0272* (2013.01); *C23C 16/045* (2013.01); *C23C 16/24* (2013.01); *H01L 21/02425* (2013.01); *H01L 21/0245* (2013.01); *H01L 21/02532* (2013.01); *H01L 21/02576* (2013.01); *H01L 21/0262* (2013.01); *H01L 21/02639* (2013.01); *H01L 21/28525* (2013.01); *H01L 21/28556* (2013.01); *H01L 21/3065* (2013.01); *H01L 21/32135* (2013.01); *H01L 21/76805* (2013.01); *H01L 21/76814* (2013.01); *H01L 21/76876* (2013.01); *H01L 21/76877* (2013.01); *H01L 29/47166* (2013.01)
USPC ............ 156/345.24; 156/345.33; 156/345.29; 118/696; 118/698; 118/704; 118/715

(58) Field of Classification Search
USPC ........... 156/345.24, 345.33, 345.29; 118/696, 118/698, 704, 715
See application file for complete search history.

(56) References Cited

U.S. PATENT DOCUMENTS 4,671,970 A * 6/1987 Keiser et al. ................ 438/427
4,868,014 A * 9/1989 Kanai et al. ................ 427/248.1

(Continued)

FOREIGN PATENT DOCUMENTS

| JP | 63-029954 | 2/1988 |
|---|---|---|
| KR | 1020080029846 | 4/2008 |
| KR | 1020090037821 | 4/2009 |

*Primary Examiner* — Rudy Zervigon
(74) *Attorney, Agent, or Firm* — Cantor Colburn LLP

(57) ABSTRACT

A film formation apparatus includes a gas supply mechanism for supplying an aminosilane-based gas, and a silane-based gas that does not include an amino group. Processes of forming a seed layer on a surface of the insulation film having the opening reaching the conductive substance and on a bottom surface of the opening by supplying the aminosilane-based gas into the process chamber, and forming a silicon film on the seed layer by supplying the silane-based gas that does not include the amino group into the process chamber, are sequentially performed in the process chamber.

8 Claims, 34 Drawing Sheets

(51) Int. Cl.
*H01L 21/285* (2006.01)
*H01L 21/3065* (2006.01)
*H01L 21/3213* (2006.01)
*H01L 21/768* (2006.01)
*C23C 16/458* (2006.01)
*C23C 16/46* (2006.01)

(56) References Cited

U.S. PATENT DOCUMENTS

| | | | |
|---|---|---|---|
| 4,971,832 A * | 11/1990 | Arai et al. | 427/575 |
| 5,141,836 A * | 8/1992 | Shirai et al. | 430/128 |
| 5,417,770 A * | 5/1995 | Saitoh et al. | 136/258 |
| 6,653,212 B1 * | 11/2003 | Yamanaka et al. | 438/485 |
| 6,982,181 B2 * | 1/2006 | Hideo | 438/30 |
| 7,033,721 B2 * | 4/2006 | Hashizume et al. | 430/128 |
| 7,569,284 B2 * | 8/2009 | Shero et al. | 428/610 |
| 7,585,752 B2 * | 9/2009 | Todd et al. | 438/488 |
| 7,968,472 B2 * | 6/2011 | Ishida et al. | 438/785 |
| 7,977,243 B2 * | 7/2011 | Sakamoto et al. | 438/694 |
| 7,977,390 B2 * | 7/2011 | Ji et al. | 516/67 |
| 8,076,251 B2 * | 12/2011 | Akae et al. | 438/786 |
| 8,168,549 B2 * | 5/2012 | Asai | 438/791 |
| 8,173,554 B2 * | 5/2012 | Lee et al. | 438/792 |
| 8,257,789 B2 * | 9/2012 | Matsunaga et al. | 427/248.1 |
| 8,387,557 B2 * | 3/2013 | Singh et al. | 118/620 |
| 8,431,494 B2 * | 4/2013 | Murakami et al. | 438/770 |
| 8,575,042 B2 * | 11/2013 | Ota et al. | 438/792 |
| 8,802,547 B2 * | 8/2014 | Kakimoto et al. | 438/482 |
| 2002/0168859 A1 * | 11/2002 | Ehara et al. | 438/694 |
| 2003/0072975 A1 * | 4/2003 | Shero et al. | 428/704 |
| 2003/0091739 A1 * | 5/2003 | Sakamoto et al. | 427/248.1 |
| 2004/0202786 A1 * | 10/2004 | Wongsenakhum et al. | 427/250 |
| 2004/0241321 A1 * | 12/2004 | Ganguli et al. | 427/255.28 |
| 2005/0191826 A1 * | 9/2005 | Bauer et al. | 438/509 |
| 2005/0271813 A1 * | 12/2005 | Kher et al. | 427/248.1 |
| 2006/0199357 A1 * | 9/2006 | Wan et al. | 438/482 |
| 2006/0216950 A1 * | 9/2006 | Matsuura | 438/775 |
| 2006/0270217 A1 * | 11/2006 | Balseanu et al. | 438/653 |
| 2006/0288935 A1 * | 12/2006 | Kato et al. | 118/715 |
| 2007/0087577 A1 * | 4/2007 | Sakamoto et al. | 438/758 |
| 2007/0117363 A1 * | 5/2007 | Sakamoto et al. | 438/587 |
| 2007/0141274 A1 * | 6/2007 | Sakamoto et al. | 427/569 |
| 2007/0202254 A1 * | 8/2007 | Ganguli et al. | 427/252 |
| 2008/0268635 A1 * | 10/2008 | Yu et al. | 438/655 |
| 2008/0286589 A1 * | 11/2008 | Shero et al. | 428/472 |
| 2009/0142874 A1 * | 6/2009 | Arai | 438/57 |
| 2009/0232985 A1 * | 9/2009 | Dussarrat et al. | 427/255.28 |
| 2010/0012030 A1 * | 1/2010 | Todd et al. | 118/708 |
| 2010/0035439 A1 * | 2/2010 | Ishida et al. | 438/763 |
| 2010/0136260 A1 * | 6/2010 | Matsunaga et al. | 427/569 |
| 2010/0255198 A1 * | 10/2010 | Cleary et al. | 427/255.39 |
| 2011/0086516 A1 * | 4/2011 | Lee et al. | 438/792 |
| 2011/0175140 A1 * | 7/2011 | Taylor et al. | 257/190 |
| 2011/0263105 A1 * | 10/2011 | Hasebe et al. | 438/482 |
| 2011/0269315 A1 * | 11/2011 | Hasebe et al. | 438/758 |
| 2011/0312192 A1 * | 12/2011 | Murakami et al. | 438/787 |
| 2012/0103518 A1 * | 5/2012 | Kakimoto et al. | 156/345.1 |
| 2012/0161405 A1 * | 6/2012 | Mohn et al. | 279/142 |
| 2012/0164844 A1 * | 6/2012 | Kakimoto et al. | 438/770 |
| 2012/0220137 A1 * | 8/2012 | Ota et al. | 438/765 |
| 2012/0267340 A1 * | 10/2012 | Kakimoto et al. | 216/37 |
| 2012/0329286 A1 * | 12/2012 | Takeda et al. | 438/781 |
| 2013/0023110 A1 * | 1/2013 | Kakimoto et al. | 438/482 |
| 2013/0084693 A1 * | 4/2013 | Kakimoto et al. | 438/482 |
| 2013/0171838 A1 * | 7/2013 | Okuda | 438/778 |
| 2013/0247937 A1 * | 9/2013 | Nunomura et al. | 134/18 |
| 2013/0252437 A1 * | 9/2013 | Sano et al. | 438/769 |
| 2013/0323915 A1 * | 12/2013 | Komori et al. | 438/494 |
| 2014/0038429 A1 * | 2/2014 | Hirose et al. | 438/792 |
| 2014/0080321 A1 * | 3/2014 | Hirose et al. | 438/792 |
| 2014/0187024 A1 * | 7/2014 | Obu et al. | 438/479 |
| 2014/0187025 A1 * | 7/2014 | Obu et al. | 438/482 |

* cited by examiner

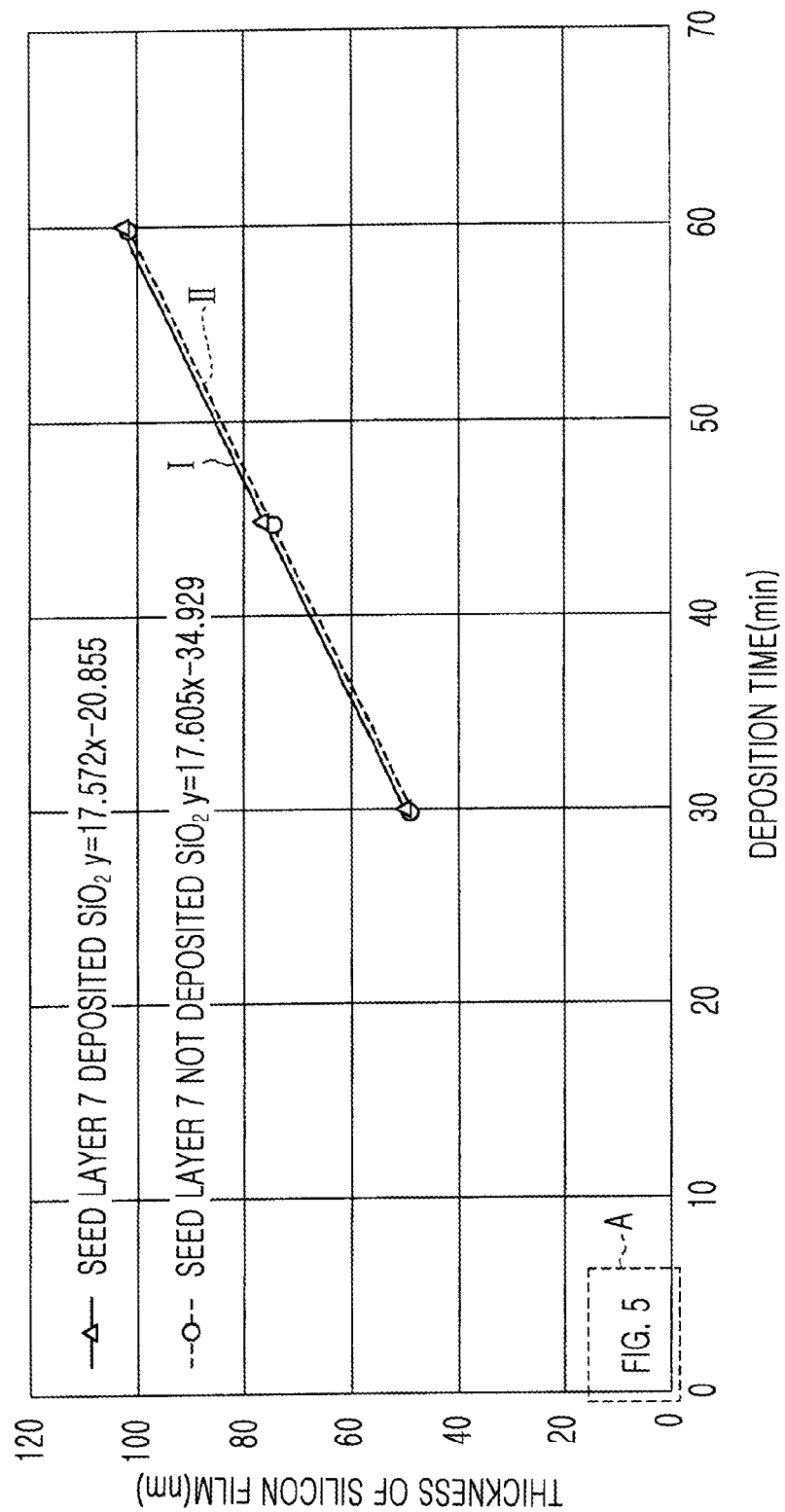

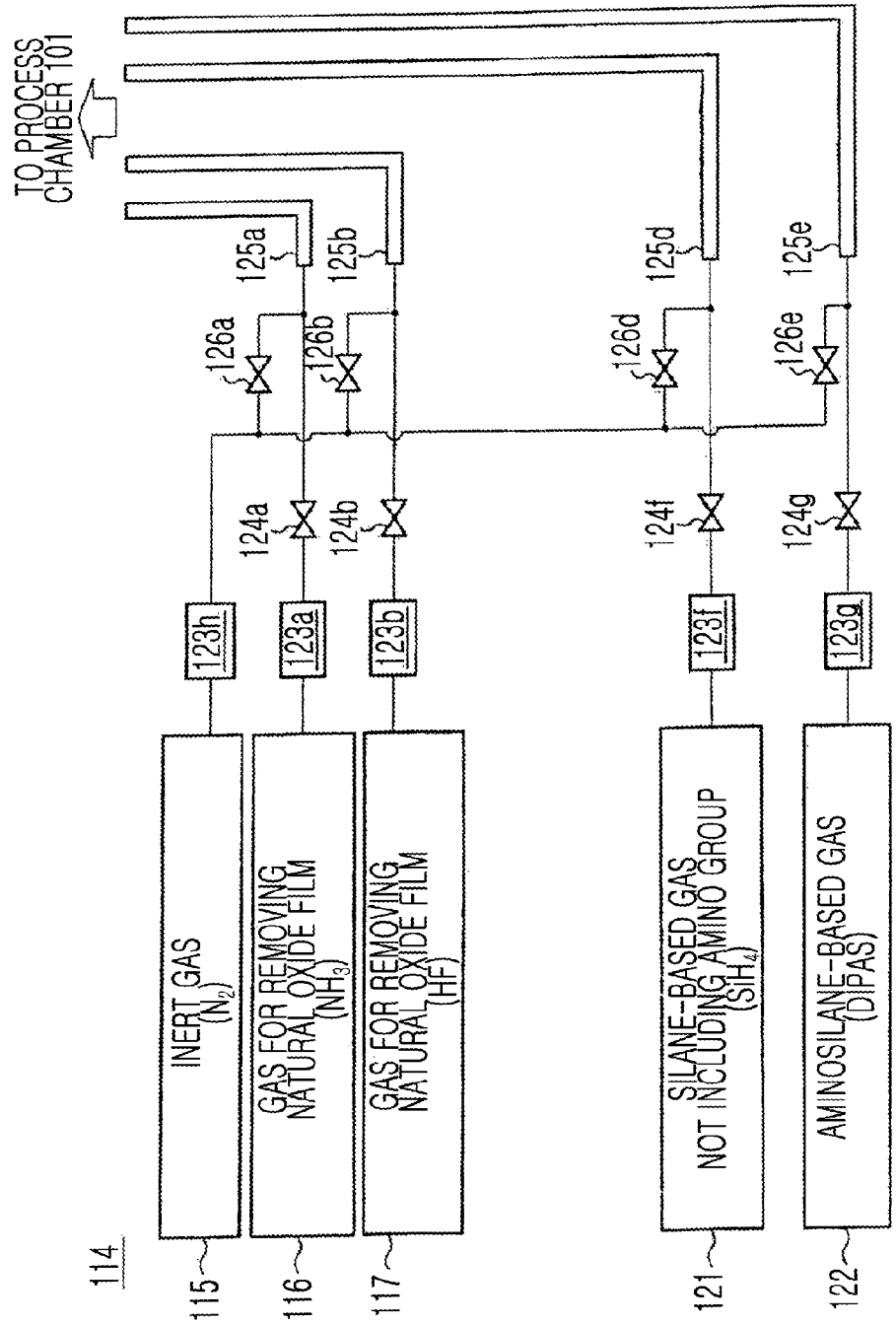

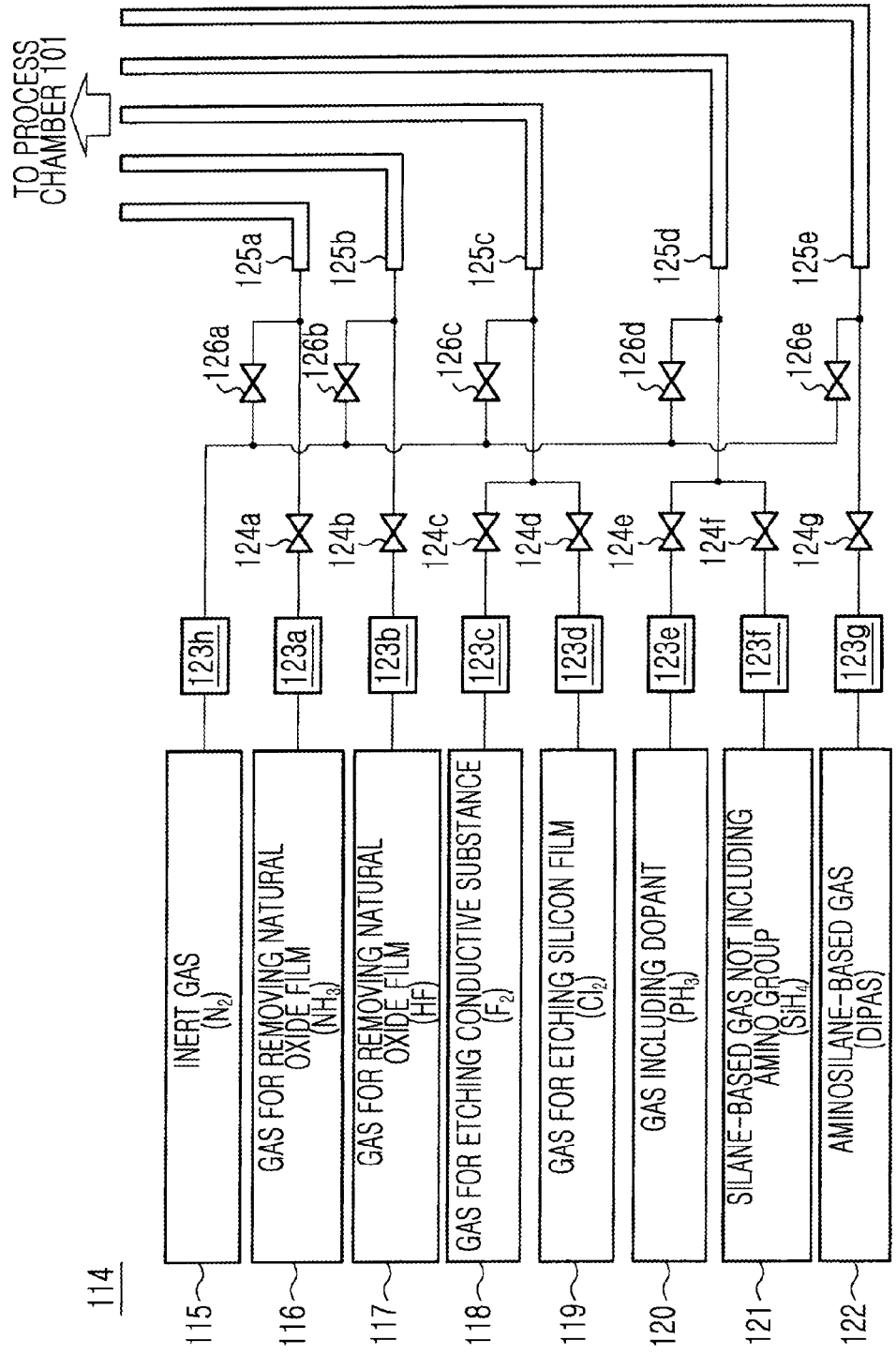

US 8,945,339 B2

FILM FORMATION APPARATUS

CROSS-REFERENCE TO RELATED PATENT APPLICATIONS

This application claims the benefits of Japanese Patent Application No. 2010-243130, filed on Oct. 29, 2010 and Japanese Patent Application No. 2011-207962, filed on Sep. 22, 2011, in the Japan Patent Office, the disclosures of which are incorporated herein in its entirety by reference.

BACKGROUND OF THE INVENTION

1. Field of the Invention

The present invention relates to a film formation apparatus.

2. Description of the Related Art

Amorphous silicon is used to fill a contact hole or a line in a semiconductor integrated circuit device. A method of forming an amorphous silicon film is disclosed in, for example, Patent reference 1.

Recently, along with miniaturization of semiconductor integrated circuit devices, filling of contact holes or lines has become strictly required.

In addition, in the field of semiconductor manufacturing apparatuses, improvement in production capacity is particularly considered as being important, as well as establishment of production technology according to the miniaturization. Semiconductor integrated circuit devices now have multiple wiring structures along with the miniaturization, and moreover, semiconductor integrated circuit devices are desired to have three-dimensional structures. In the semiconductor integrated circuit devices having the multiple wiring structures or the three-dimensional structures, filling processes are frequently used. In order to further improve the production capacity, it is a top priority to improve a throughput of the filling process.

3. Prior Art Reference (Patent Reference 1) Japanese Patent Laid-open Publication No. sho 63-29954

SUMMARY OF THE INVENTION

The present invention provides a film formation apparatus capable of producing semiconductor integrated circuit devices, in which filling processes are frequently performed, with a high production capability by improving a throughput of the filling processes.

According to an aspect of the present invention, a film formation apparatus used to fill an opening provided on an insulation film, the opening reaching a conductive substance, the film formation apparatus includes: a process chamber which holds an object to be processed having the insulation film provided on the conductive substance, the insulation film having the opening reaching the conductive substance; and a gas supply mechanism which is provided in the process chamber and supplies an aminosilane-based gas, and a silane-based gas that does not include an amino group, wherein processes of 1) forming a seed layer on a surface of the insulation film having the opening reaching the conductive substance and on a bottom surface of the opening by supplying the aminosilane-based gas into the process chamber, and 2) forming a silicon film on the seed layer by supplying the silane-based gas that does not include the amino group into the process chamber, may be sequentially performed in the process chamber.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 4 is a diagram showing a relationship between deposition times and thicknesses of an amorphous silicon film;

FIG. 7 is a schematic block diagram showing an example of a gas supply mechanism included in a film formation apparatus according to a second embodiment of the present invention;

FIG. 14 is a schematic block diagram showing an example of a gas supply mechanism included in a film formation apparatus according to a fifth embodiment of the present invention;

DETAILED DESCRIPTION OF THE INVENTION

Figure 1:
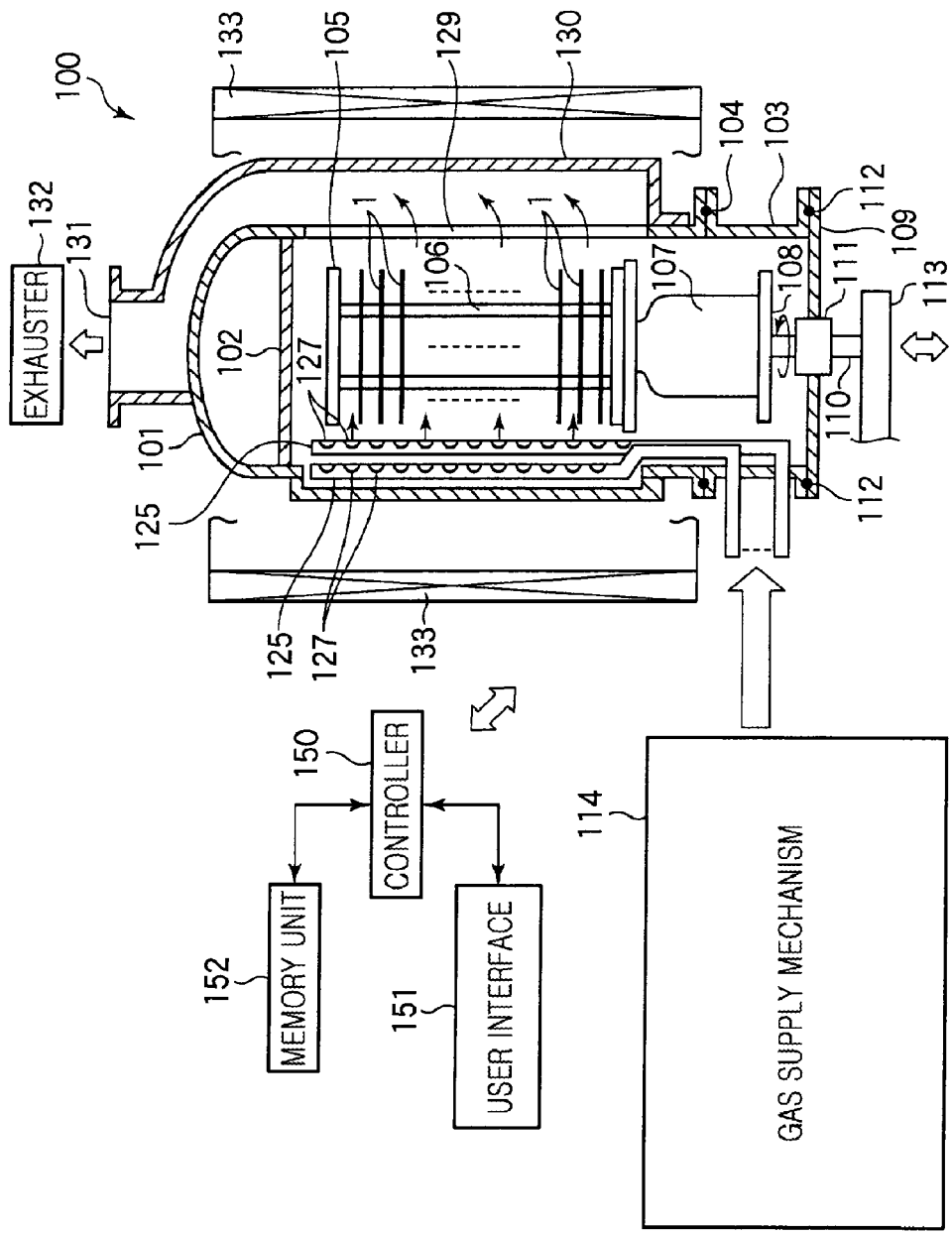
FIG. 1 is a schematic cross-sectional view of a film formation apparatus according to a first embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 1 is a schematic cross-sectional view showing an example of a film formation apparatus 100 according to a first embodiment of the present invention.

As shown in FIG. 1, the film formation apparatus 100 includes a process chamber 101 having a shape of a bottom-open cylinder with ceiling. The entire process chamber 101 may be formed of, for example, quartz. A ceiling plate 102 formed of quartz is provided on the ceiling of the process chamber 101. A manifold 103, which is formed of, for example, a stainless steel and has a cylinder, is connected to a bottom opening of the process chamber 101 via a sealing member 104 such as an O-ring.

The manifold 103 supports a bottom of the process chamber 101. A wafer boat 105 formed of quartz is provided to be capable of inserting into the process chamber 101 from below the manifold 103. The wafer boat 105 can hold a plurality of, for example, 50 to 100, semiconductor substrates (n-type silicon substrates 1 doped with n-type impurities in the present embodiment) as object to be processed in a multi stage manner. Accordingly, in the process chamber 101 according to the present embodiment, the objects to be processed, each including an n-type silicon substrate (wafer) 1 on which an insulating film having an opening reaching the n-type silicon substrate 1 is formed, are held. The wafer boat 105 includes a plurality of pillars 106, and recesses provided in the pillars 106 support the plurality of n-type silicon substrates 1.

The wafer boat 105 is placed on a table 108 via a thermos vessel 107 formed of quartz. The table 108 is supported on a rotation shaft 110 that penetrates through a cover unit 109 that is formed of, for example, stainless steel, to open/close the bottom opening of the manifold 103. A magnetic fluid seal 111, for example, is provided on a penetration portion of the rotation shaft 110 so as to rotatably support the rotation shaft 110 while sealing the rotation shaft 110 airtight. A sealing member 112 formed of, for example, an O-ring, is interposed between a circumferential portion of the cover unit 109 and the lower end portion of the manifold 103. Accordingly, sealing in the process chamber 101 is maintained. The rotation shaft 110 is attached to a leading end of an arm 113 supported by an elevating mechanism (not shown), for example, a boat elevator. Therefore, the wafer boat 105, the cover unit 109, and the like are integrally elevated to be inserted into or pulled out from the process chamber 101.

The film formation apparatus 100 includes a gas supply mechanism 114 for supplying a gas used to perform a process into the process chamber 101.

Figure 2:
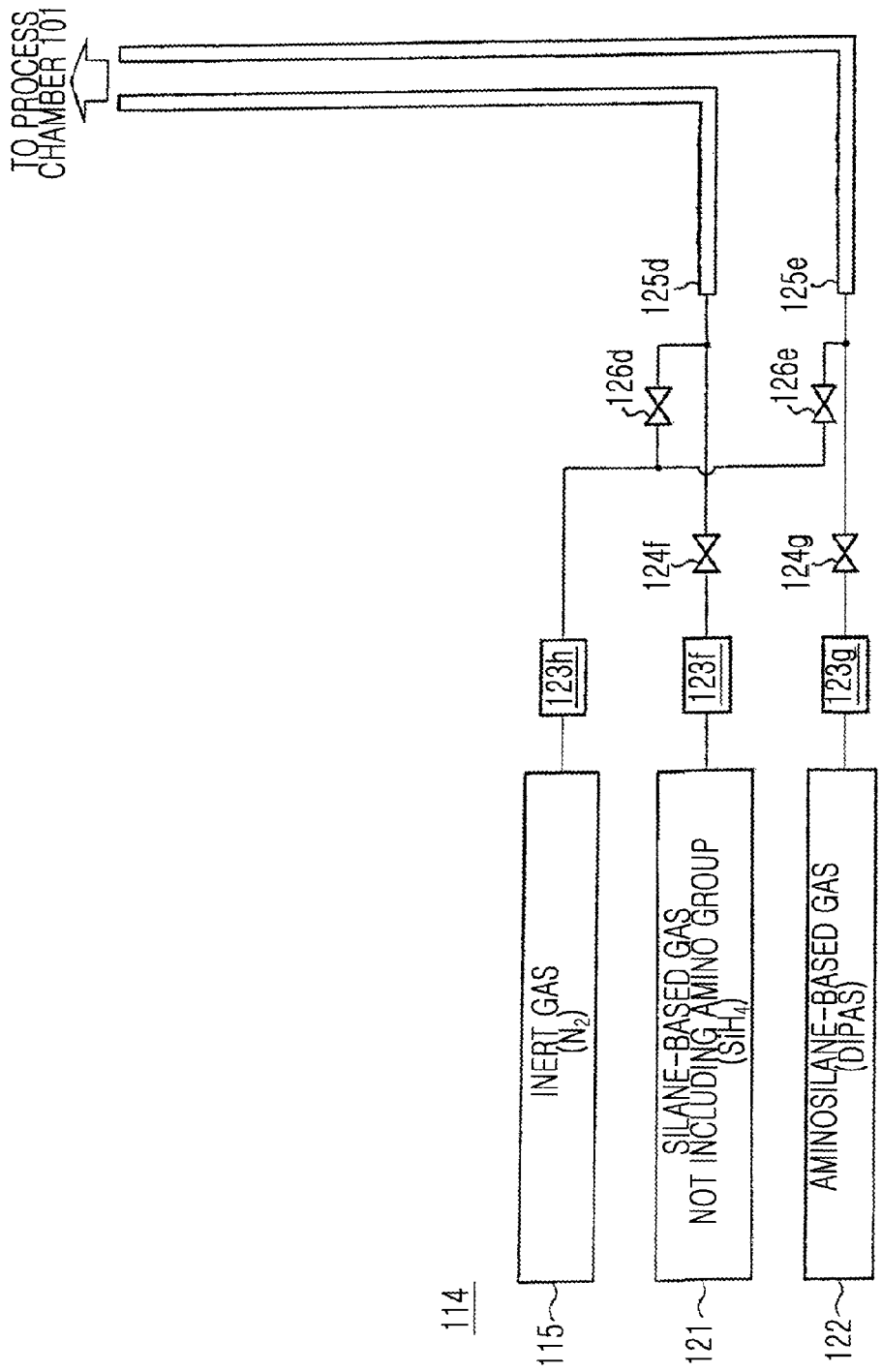
FIG. 2 is a schematic block diagram of an example of a gas supply mechanism shown in FIG. 1.

FIG. 2 is a schematic block diagram showing an example of the gas supply mechanism 114 shown in FIG. 1.

The gas supply mechanism 114 according to the present embodiment includes an inert gas supply source 115 for supplying an inert gas, a silane-based gas supply source 121 for supplying a silane-based gas not including an amino group, and an aminosilane-based gas supply source 122 for supplying an aminosilane-based gas. In the present embodiment, following gases are prepared or ready to be generated as examples of the above gases.

Inert gas: nitrogen ($N_2$) gas silane-based gas not including an amino group: monosilane ($SiH_4$) gas aminosilane-based gas: diisopropylaminosilane (DIPAS) gas A gas supply source included in the gas supply mechanism 114 is connected to a plurality of distribution nozzles 125. In the present embodiment, the silane-based gas supply source 121 is connected to a distribution nozzle 125d via a flow rate controller 123f and an opening/closing valve 124f, and the aminosilane-based gas supply source 122 is connected to a distribution nozzle 125e via a flow rate controller 123g and an opening/closing valve 124g.

In addition, the inert gas supply source 115 is connected to the distribution nozzles 125d and 125e, respectively, via a flow rate controller 123h and opening/closing valves 126d and 126e. The inert gas is used as a diluting gas for diluting the silane-based gas not including an amino group and the aminosilane-based gas, a carrier gas, or a purge gas for purging inside the process chamber 101.

In addition, when the inert gas is used as the purge gas, the inert gas supply source 115 may be connected to a gas introducing port (not shown) that is separately provided from the distribution nozzles 125d and 125e. The gas introducing port (not shown) may be provided, for example, to penetrate inward through a side wall of the manifold 103. In addition, the gas introducing port has a gas ejecting hole that is greater than that of the distribution nozzle 125d or 125e, and supplies the inert gas into the process chamber 101 from a lower portion of the process chamber 101 to a height-wise direction of the process chamber 101 via the inner side of the manifold 103.

Each of the plurality of distribution nozzles 125 (in the present embodiment, the distribution nozzles 125d and 125e) is formed of a quartz tube, and penetrates through a side wall of the manifold 103 into the manifold 103 and then bends upward. In addition, each of the distribution nozzles is extended into the process chamber 101 in a vertical direction as shown in FIG. 1. In addition, in FIG. 1, in a vertical portion in each of the distribution nozzles 125, a plurality of gas ejecting holes 127 are provided at predetermined intervals. The gases are uniformly ejected into the process chamber 101 from each of the gas ejecting holes 127 to a horizontal direction.

An exhaust port 129 for evacuating the process chamber 101 is provided in an opposite to the distribution nozzles 125 in the process chamber 101. The exhaust port 129 is provided to be narrow and long by vertically cutting the sidewall of the process chamber 101. The exhaust port cover unit 130 having a U-shaped cross-section for covering the exhaust port 129 is attached to a portion of the process chamber 101 corresponding to the exhaust port 129 by a welding process. The exhaust port cover unit 130 extends upward along the sidewall of the process chamber 101, and defines a gas outlet 131 on a top of the process chamber 101. An exhauster 132 including a vacuum pump or the like is connected to the gas outlet 131. The exhauster 132 evacuates an inside of the process chamber 101 to exhaust a process gas used in a process and set the pressure inside the process chamber 101 to be a process pressure according to a process.

A barrel-shaped heating device 133 is disposed to surround the outer circumference of the process chamber 101. The heating device 133 activates a gas supplied into the process chamber 101, and at the same time, heats the object to be processed in the process chamber 101, for example, the semiconductor substrates, that is, the n-type silicon substrates 1 in the present embodiment.

Each of components of the film formation apparatus 100 is controlled by a controller 150 that is, for example, a microprocessor (computer). A user interface 151 including a keyboard that receives an input operation of a command or the like for an operator to control the film formation apparatus 100 or a display that visibly displays an operating state of the film formation apparatus 100 is connected to the controller 150.

A memory unit 152 is connected to the controller 150. The memory unit 152 stores a control program for accomplishing various processes executed in the film formation apparatus 100 under the control of the controller 150, or a program, that is, a recipe, for making each of components of the film formation apparatus 100 execute a process according to process conditions. The recipe is stored in a storage medium in the memory unit 152, for example. The storage medium may be a hard disk, a semiconductor memory, or a portable type such as a CD-ROM, a DVD, or a flash memory. Also, the recipe may be suitably transmitted from another device via, for example, a dedicated line. If required, processes desired by the film formation apparatus 100 are performed under the control of the controller 150 by invoking a recipe from the memory unit 152 according to instructions or the like from the user interface 151. In the present embodiment, a film formation method that will be described as follows is sequentially performed in one process chamber 101 under the control of the controller 150.

Figure 3A:
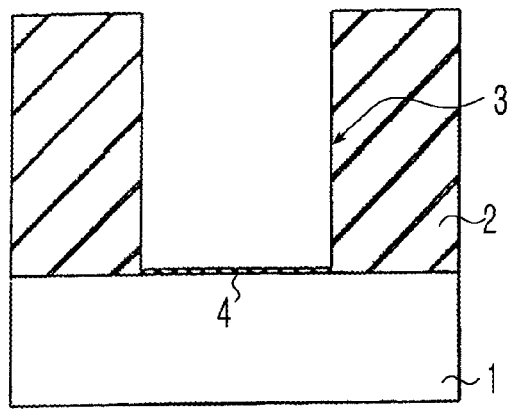
FIGS. 3A through 3C are cross-sectional views showing an example of a film formation method executable by the film formation apparatus according to the first embodiment of the present invention.
Figure 3B:
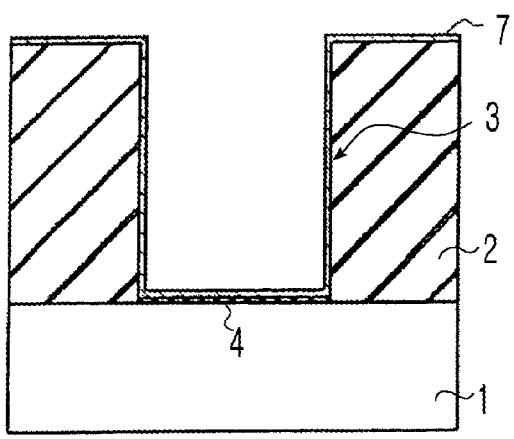
Figure 3C:
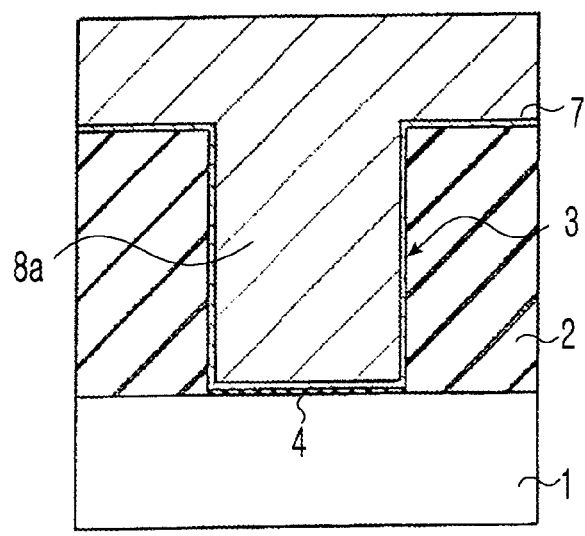

FIGS. 3A through 3C are cross-sectional views showing an example of a film formation method executable by a film formation apparatus according to a first embodiment of the present invention.

First, FIG. 3A is a cross-sectional view illustrating that a contact hole 3 reaching a n-type silicon substrate 1 is provided on an interlayer insulation film 2 formed on the n-type silicon substrate 1.

As shown in FIG. 3A, after providing the contact hole 3, when the n-type silicon substrate 1 is transferred from a process chamber of an etching apparatus, a thin natural oxide film 4 is grown on a surface of the n-type silicon substrate 1 exposed on a bottom of the contact hole 3. The natural oxide film 4 causes a contact resistance to increase. Thus, the natural oxide film 4 may be removed. However, for example, when a contact hole has a large diameter D, and operations of the semiconductor integrated circuit device are not affected by the increased contact resistance even when the contact resistance is increased due to the natural oxide film 4, the natural oxide film 4 may not be necessarily removed. In the present embodiment, the natural oxide film 4 is not removed.

Next, the n-type silicon substrate 1 on which the natural oxide film 4 is grown is transferred into the process chamber 101 of the film formation apparatus 100 shown in FIG. 1. After the transferring into the process chamber 101, the heating apparatus 133 heats an inside of the process chamber 101 to a predetermined temperature. In the present embodiment, a temperature inside the process chamber 101 is adjusted such that a temperature of the n-type silicon substrate 1 is about 300° C. to 550° C., for example.

Next, the opening/closing valves 124g and 126e are opened so as to supply the nitrogen ($N_2$) gas and the diisopropylaminosilane (DIPAS) gas into the process chamber 101 respectively from the inert gas supply source 115 and the aminosilane-based gas supply source 122 via the distribution nozzle 125e. Through the above process, as shown in FIG. 3B, a seed layer 7 is formed on a surface of the interlayer insulation film 2 and the bottom surface of the contact hole 3. When the process is finished, the opening/closing valve 124g is closed to stop the supply of the DIPAS gas, and at the same time, an atmosphere inside the process chamber 101 is purged by using the $N_2$ gas. After that, the exhauster 132 is stopped and the opening/closing valve 126e is closed to stop the supply of the $N_2$ gas.

Next, the temperature inside the process chamber 101 is adjusted such that the temperature of the n-type silicon substrate 1 is about 400° C. to 650° C., for example. In addition, the opening/closing valves 124f and 126d are opened so as to supply the $N_2$ gas and the monosilane ($SiH_4$) gas into the process chamber 101 from the inert gas supply source 115 and the silane-based gas supply source 121 via the distribution nozzle 125d. Through the above process, as shown in FIG. 3C, a silicon film, that is, an amorphous silicon film 8a in the present embodiment, is formed on the seed layer 7, to thereby fill the contact hole 3. When the process is finished, the opening/closing valve 124f is closed to stop the supply of the $SiH_4$ gas, and at the same time, the atmosphere inside the process chamber 101 is purged by using the $N_2$ gas. After that, the exhauster 132 is stopped and the opening/closing valve 126d is closed to stop the supply of the $N_2$ gas.

FIG. 4 is a diagram illustrating a relationship between deposition times and thicknesses of the amorphous silicon film 8a. FIG. 4 shows results for a case where a base is a silicon oxide film ($SiO_2$). The base corresponds to the interlayer insulation film 2 in the present embodiment.

The followings are process conditions used in the present embodiment.
  flow rate of the DIPAS: 500 sccm
  process time: 5 min
  process temperature: 400° C.
  process pressure: 53.2 Pa (0.4 Torr)
  Likewise, the followings are process conditions for forming the amorphous silicon film 8a of the present embodiment.
  flow rate of the monosilane gas: 500 sccm
  deposition time: 30 min/45 min/60 min
  process temperature: 500° C.
  process pressure: 53.2 Pa (0.4 Torr)

The thicknesses of the amorphous silicon film 8a were measured respectively when the deposition times were 30 minutes, 45 minutes, and 60 minutes.

In FIG. 4, a line I denotes a result when the seed layer 7 is formed, and a line II denotes a result when the seed layer 7 is not formed. The lines I and II are approximation lines obtained from the three measurements of the thickness by using the method of least squares and expressions thereof are following Equations (1) and (2).

$$\text{Line I: } y = 17.572x - 20.855 \tag{1}$$

$$\text{Line II: } y = 17.605x - 34.929 \tag{2}$$

As shown in FIG. 4, when the seed layer 7 is formed, an increased tendency of the thickness of the amorphous silicon film 8a is clear when compared with the case where the seed layer 7 is not formed.

Figure 5:
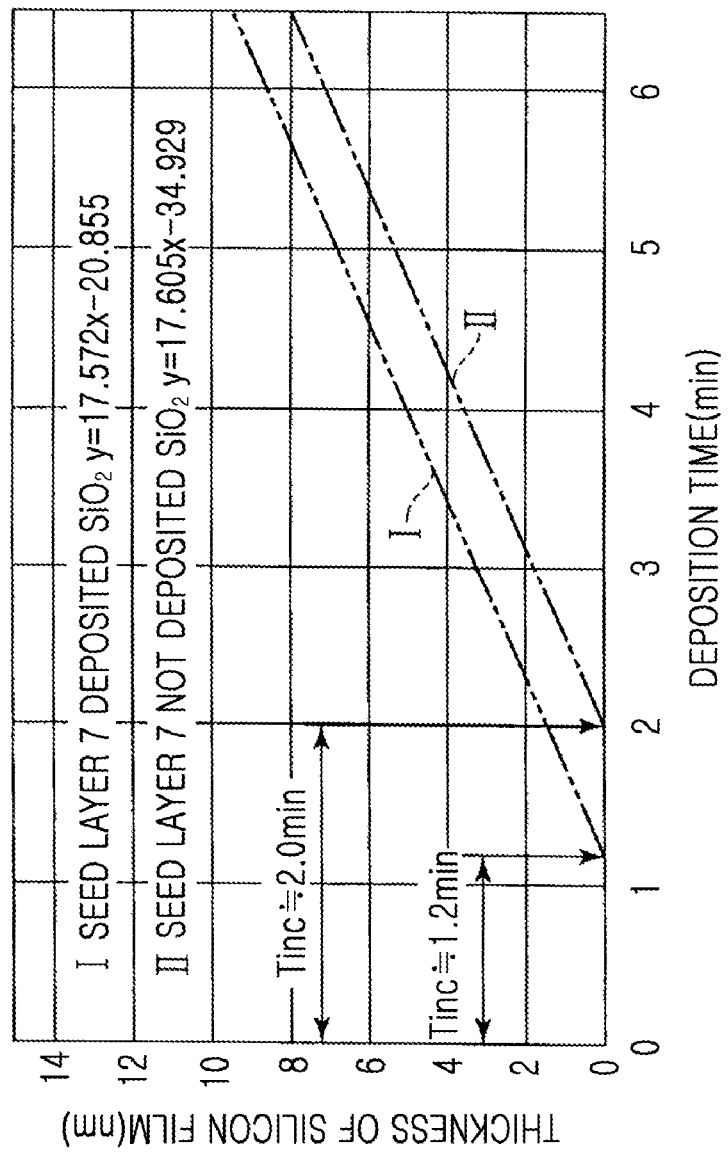
FIG. 5 is an enlarged view of a portion A of FIG. 4 indicated by the broken line.

When y is 0 in Equations (1) and (2) above, that is, the thickness of the amorphous silicon film 8a is 0, points of intersections of the lines I and II and the deposition time are shown in a graph of FIG. 5.

In addition, FIG. 5 is an enlarged view of a portion A of FIG. 4 indicated by the broken line.

As shown in FIG. 5, when the base is the silicon oxide film and the seed layer 7 is formed on the base, a deposition of the amorphous silicon film 8a starts at about 1.2 minutes (x≈1.189) after initiating the process. On the other hand, when the base is the silicon oxide film and seed layer 7 is not formed on the base, a deposition of the amorphous silicon film 8a starts at about 2 minutes (x≈1.984) after initiating the process.

As described above, since the seed layer 7 is formed on the base by using the aminosilane-based gas, an incubation time may be reduced from about 2 minutes to about 1.2 minutes.

According to the film formation apparatus 100 of the first embodiment, filling of the contact hole 3 is performed by forming the seed layer 7 on the surface of the interlayer insulation film 2 and the bottom surface of the contact hole 3 by using the aminosilane-based gas, and forming the silicon film, that is, the amorphous silicon film 8a in the present embodiment, on the seed layer 7 by using the silane-based gas that does not include the amino group. According to the above processes, the incubation time of the amorphous silicon film 8a may be reduced less than that of a case where the seed layer 7 is not formed.

As described above, because the incubation time of the amorphous silicon film 8a filling the contact hole 3 may be reduced, a throughput of the filling process may be improved. Therefore, the film formation apparatus 100 having excellent production capability may be provided even when filling processes are frequently performed in the semiconductor integrated circuit device.

Modified Example

Figure 6A:
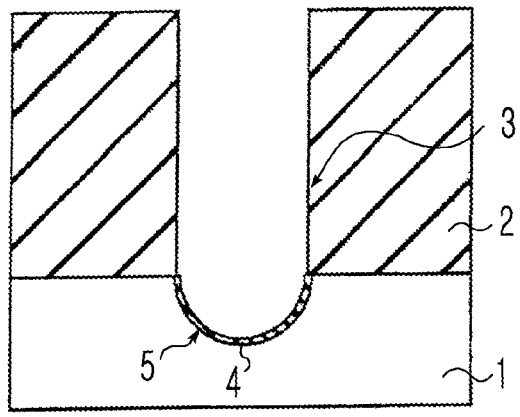
FIGS. 6A through 6C are cross-sectional views showing a modified example of a film formation method executable by the film formation apparatus according to the first embodiment of the present invention.
Figure 6B:
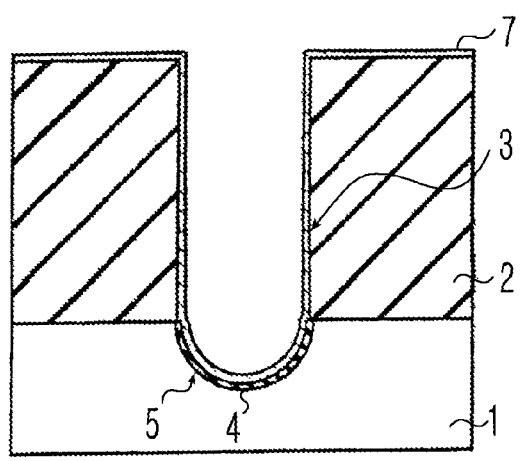
Figure 6C:
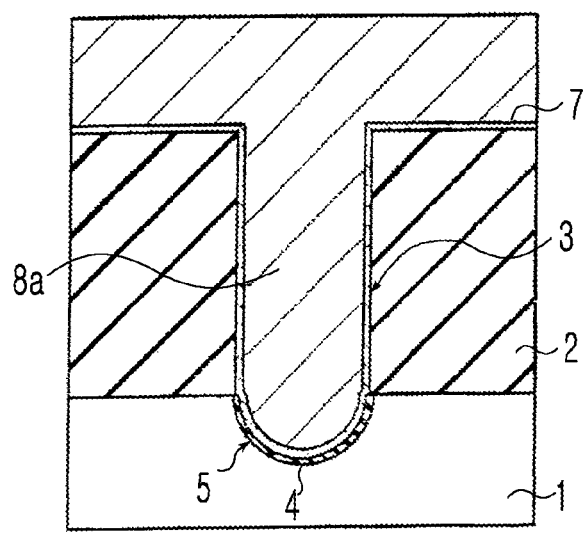

FIGS. 6A through 6C are cross-sectional views showing modified examples of the film formation method executable by the film forming apparatus according to the first embodiment of the present invention.

Since the contact hole 3 is miniaturized, the diameter D of the contact hole 3 is reduced as shown in FIG. 6A, a surface area of the contact portion is reduced, and thus the contact resistance is increased. To address the problem of the increased contact resistance, as denoted by reference numeral 5 in FIG. 6A, the bottom of the contact hole 3 may be recessed to increase the surface area of the contact portion.

The first embodiment of the present invention may be applied as shown in FIGS. 6A through 6C even in the semiconductor integrated circuit device having the contact hole 3, the bottom of which is recessed.

In addition, the difference between the previous example of the first embodiment and the modified example is with respect to whether the bottom of the contact hole 3 is recessed or not, and the film formation method is the same as that described with reference to FIGS. 3A through 3C. Therefore, descriptions of the modified example are as shown in FIGS. 6A through 6C.

In addition, embodiments described below are described according to an example in which the bottom of the contact hole 3 is recessed.

Second Embodiment

FIG. 7 is a block diagram showing an example of a gas supply mechanism included in a film formation apparatus according to a second embodiment of the present invention.

As shown in FIG. 7, the gas supply mechanism 114 included in the film formation apparatus according to the present embodiment is different from the gas supply mechanism 114 of the film formation apparatus according to the first embodiment in that a gas supply source that supplies a gas for removing a natural oxide film is additionally provided.

In the present embodiment, two kinds of gases are used to remove the natural oxide film, and thus, a first gas supply source 116 that supplies a first gas for removing the natural oxide film and a second gas supply source 117 that supplies a second gas for removing the natural oxide film are provided.

In the present embodiment, the following gases are prepared or configured to be generated as examples of the above first and second gases.

first gas: ammonia ($NH_3$) gas
second gas: hydrogen fluoride (HF) gas

The first gas supply source 116 is connected to a distribution nozzle 125a via a flow rate controller 123a and an opening/closing valve 124a. Likewise, the second gas supply source 117 is connected to a distribution nozzle 125b via a flow rate controller 123b and an opening/closing valve 124b.

Each of the distribution nozzles 125a and 125b is formed of a quartz tube like the other distribution nozzles, and penetrates through a side wall of the manifold 103 into the manifold 103 and then bends upward. In addition, as shown in FIG. 1, each of the distribution nozzles 125a and 125b is extended into the process chamber 101 in a vertical direction.

FIGS. 8A through 8D are cross-sectional views showing an example of a film formation method executable by the film formation apparatus 100 according to the second embodiment of the present invention.

Figure 8A:
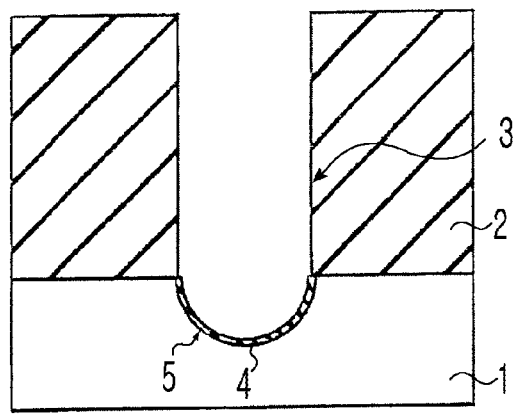
FIGS. 8A through 8D are cross-sectional views showing an example of a film formation method executable by the film formation apparatus according to the second embodiment of the present invention.
Figure 8B:
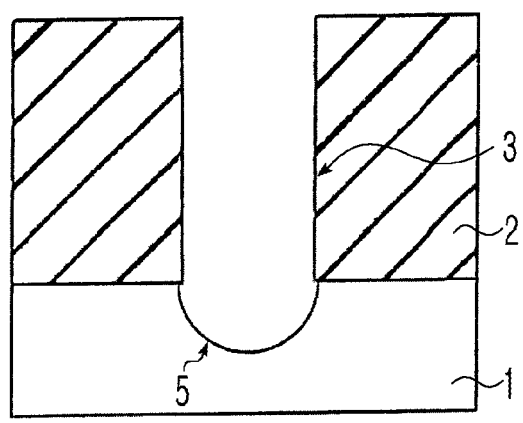

First, as shown in FIG. 8A, an n-type silicon substrate 1 on which the natural oxide film 4 is grown is transferred into a process chamber 101 of the film formation apparatus 100. After the n-type silicon substrate 1 is transferred in, the heating apparatus 133 heats the process chamber 101 to a predetermined temperature. In the present embodiment, a temperature inside the process chamber 101 is adjusted such that a temperature of the n-type silicon substrate 1 is about 20° C. to 300° C. In addition, opening/closing valves 124a, 124b, 126a, and 126b shown in FIG. 7 are opened so as to supply the nitrogen ($N_2$) gas, the ammonia ($NH_3$) gas, and the hydrogen fluoride (HF) gas into the process chamber 101 respectively from the inert gas supply source 115, the first gas supply source 116, and the second gas supply source 117 via the distribution nozzles 125a and 125b. Through the above process, the natural oxide film 4 formed on the surface of the n-type silicon substrate 1 that is exposed at the bottom of the contact hole 3 is removed, as shown in FIG. 8B. When the process is finished, the opening/closing valves 124a and 124b are closed to stop the supplies of the $NH_3$ gas and the HF gas. In addition, the process chamber 101 is evacuated by the exhauster 132 so as to supply the $N_2$ gas into the process chamber 101 and to purge an atmosphere inside the process chamber 101 by using the $N_2$ gas. After that, the exhauster 132 is stopped and the opening/closing valves 126a and 126b are closed to stop the supply of the $N_2$ gas.

Figure 8C:
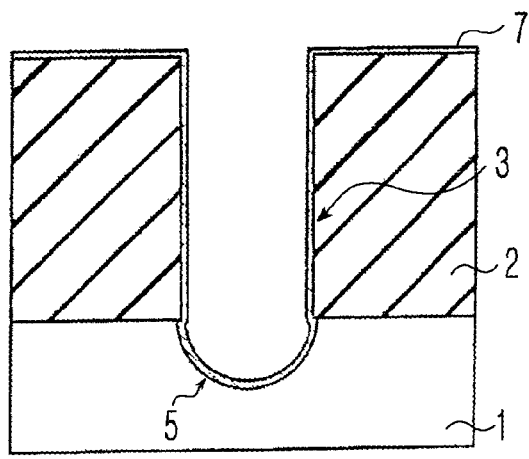
Figure 8D:
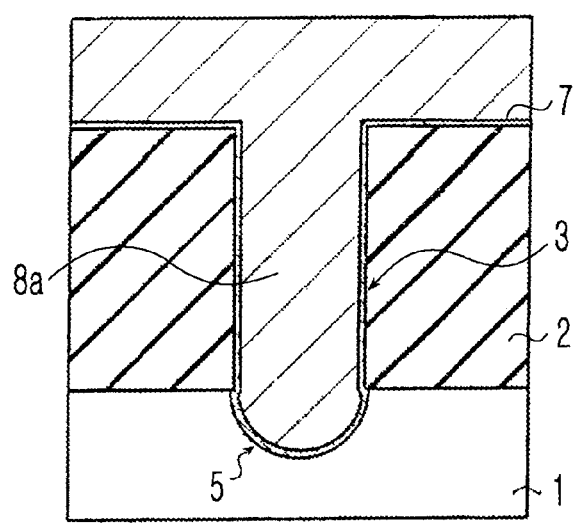

After that, as shown in FIGS. 8C and 8D, the seed layer 7 and the amorphous silicon film 8a are formed according to the film formation method described with reference to FIGS. 3B and 3C.

According to the film formation apparatus of the second embodiment, the filling process of the contact hole 3 is performed in the same manner as that of the first embodiment, and thus, the incubation time of the amorphous silicon film 8a filling the contact hole 3 may be reduced, and the throughput of the filling process may be improved. Therefore, like the previous embodiment, the film formation apparatus 100 having an excellent production capability with respect to the semiconductor integrated circuit device in which the filling processes are frequently performed may be obtained.

Additionally, according to the film formation apparatus of the present embodiment, the natural oxide film 4 may be removed, and thus, an increase in the contact resistance may be prevented.

In addition, the natural oxide film 4 is removed in the process chamber of the film formation apparatus, in which forming of the amorphous silicon film 8a is performed. Therefore, the forming of the amorphous silicon film 8a may be performed rapidly after removing the natural oxide film 4. Accordingly, deterioration of the throughput in the filling process caused by the removal of the natural oxide film 4 may be prevented.

Third Embodiment

Figure 9:
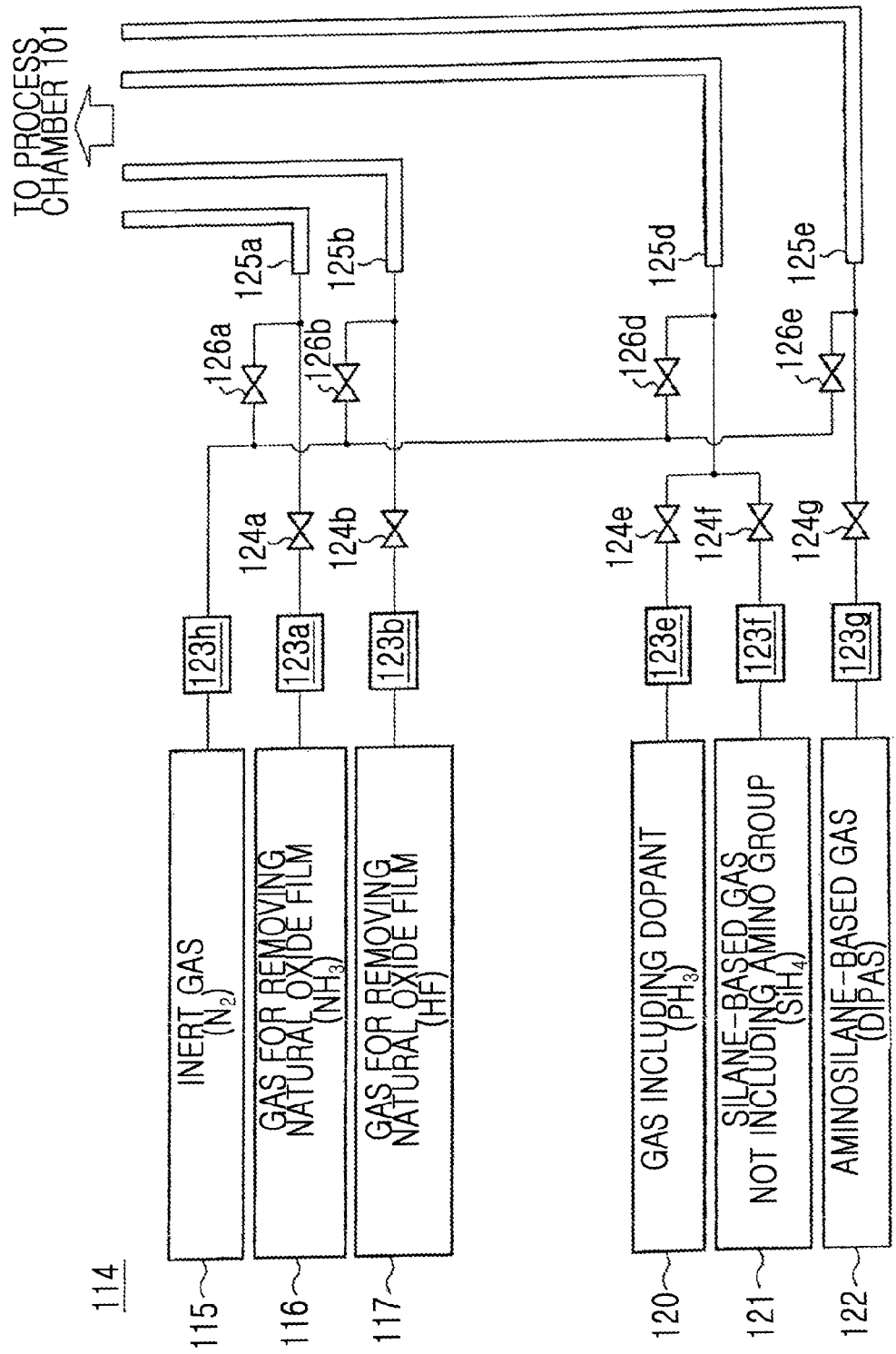
FIG. 9 is a schematic block diagram showing an example of a gas supply mechanism included in a film formation apparatus according to a third embodiment of the present invention.

FIG. 9 is a schematic block diagram showing an example of a gas supply mechanism included in a film formation apparatus according to a third embodiment of the present invention.

As shown in FIG. 9, the gas supply mechanism 114 included in the film formation apparatus according to the third embodiment of the present invention is different from the gas supply mechanism 114 in the film formation apparatus according to the second embodiment in that a dopant gas supply source 120 that supplies a gas including a dopant is additionally provided.

In the present embodiment, n-type impurities that have the same conductive type as the n-type silicon substrate 1 is used as the dopant. The dopant gas supply source 120 prepares or generates the following gas including the n-type impurities.

dopant gas: phosphine ($PH_3$) gas

The dopant gas supply source 120 is connected to a distribution nozzle 125d via a flow rate controller 123e and an opening/closing valve 124e.

Figure 10A:
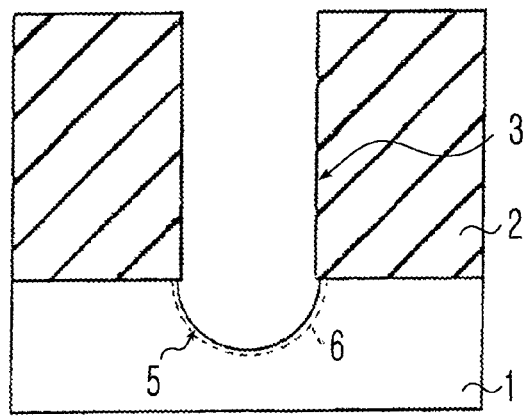
FIGS. 10A through 10C are cross-sectional views showing an example of a film formation method executable by the film formation apparatus according to the third embodiment of the present invention.
Figure 10B:
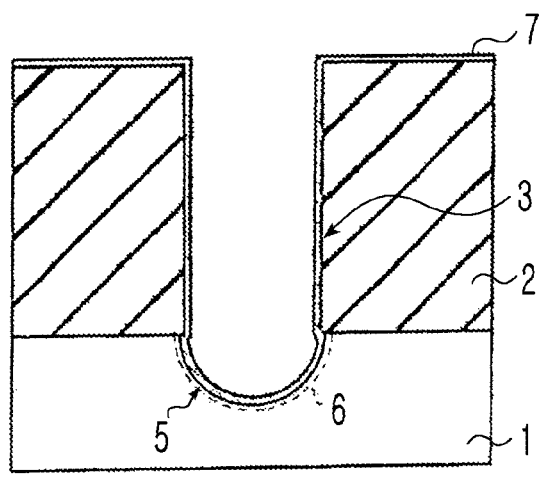
Figure 10C:
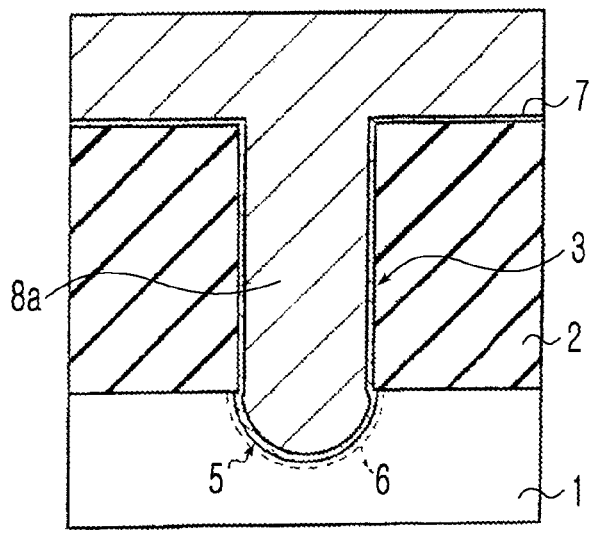

FIGS. 10A through 10C are cross-sectional views showing an example of a film formation method executable by the film formation apparatus according to the third embodiment of the present invention.

For example, the natural oxide film 4 on the surface of the n-type silicon substrate 1 that is exposed on the bottom of the contact hole 3 is removed according to the film formation method described in the second embodiment. After that, the temperature inside the process chamber 101 is adjusted such that the temperature of the n-type silicon substrate 1 is about 400° C. to 650° C., for example. In addition, the opening/closing valves 124e and 126d are opened so as to supply the $N_2$ gas and the phosphine ($PH_3$) gas into the process chamber 101 from the inert gas supply source 115 and the dopant gas supply source 120 via the distribution nozzle 125d.

Through the above process, n-type impurities, that is, phosphorous (P), are adsorbed onto the recessed surface of the n-type silicon substrate 1 as denoted by reference numeral 6, as shown in FIG. 10A, and thus a concentration of the n-type impurities on the surface of the n-type silicon substrate 1 is increased. Consequently, contact resistance of the surface of the n-type silicon substrate 1 is reduced. When the process is finished, the opening/closing valve 124e is closed to stop the supply of the $PH_3$ gas, and at the same time, the atmosphere inside the process chamber 101 is purged by using the $N_2$ gas. After that, the exhauster 132 is stopped and the opening/closing valve 126d is closed to stop the supply of the $N_2$ gas.

After that, as shown in FIGS. 10B and 10C, the seed layer 7 and the amorphous silicon film 8a are formed according to the film formation method described with reference to FIGS. 3B and 3C.

According to the film formation apparatus of the third embodiment, the filling process of the contact hole 3 is performed in the same manner as that of the first embodiment. Therefore, like the first embodiment, the film formation apparatus 100 having an excellent production capability with respect to the semiconductor integrated circuit device in which the filling processes are frequently performed may be obtained.

In addition, according to the film formation apparatus of the third embodiment, the n-type impurities may be introduced onto the surface of the n-type silicon substrate 1 located on the bottom of the contact hole 3. Therefore, the concentration of the n-type impurities on the n-type silicon substrate 1 located on the bottom of the contact hole 3 may be increased, and thus, the contact resistance may be reduced.

Moreover, introducing of the n-type impurities is performed in the process chamber of the film formation apparatus 100, in which the amorphous silicon film 8a is formed. Therefore, the forming of the amorphous silicon film 8a may be performed rapidly after introducing the n-type impurities. Accordingly, when the n-type impurities are introduced, deterioration of the throughput in the filling process may be prevented.

Modified Example

Figure 11A:
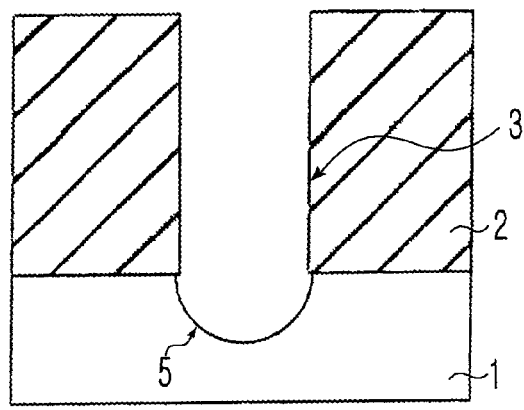
FIGS. 11A through 11C are cross-sectional views showing a modified example of a film formation method executable by the film formation apparatus according to the third embodiment of the present invention.
Figure 11B:
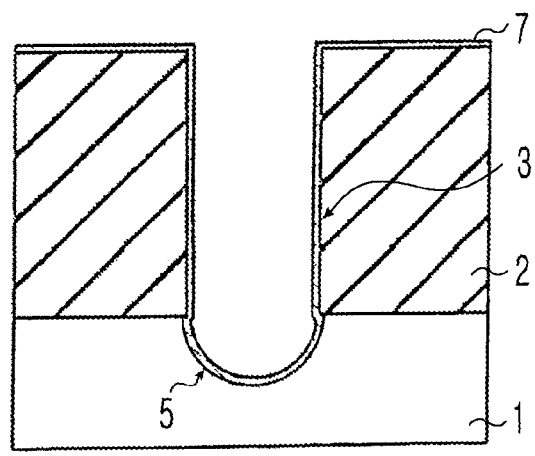
Figure 11C:
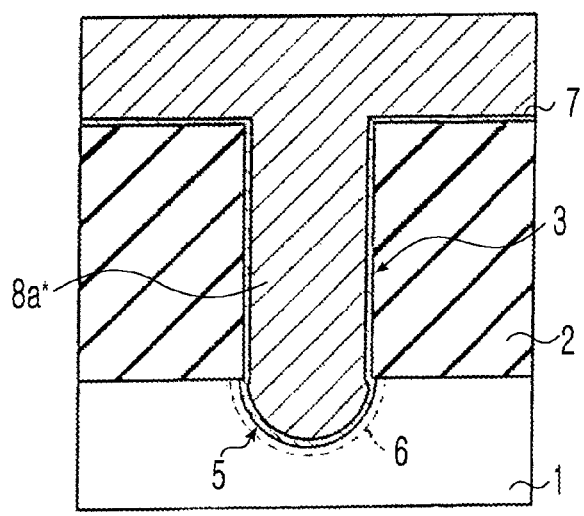

FIGS. 11A through 11C are cross-sectional views showing a modified example of the film formation method executable by the film formation apparatus according to the third embodiment of the present invention.

In the third embodiment, the n-type impurities are introduced onto the n-type silicon substrate 1; however, the n-type impurities may be introduced onto the amorphous silicon film 8a.

As shown in FIGS. 11A and 11B, the seed layer 7 is formed according to the film formation method described with reference to FIGS. 8B and 8C, and after that, the opening/closing valves 124e, 126d, and 124f are opened so as to supply the $N_2$ gas, the $PH_3$ gas, and the monosilane gas into the process chamber 101 from the inert gas supply source 115, the dopant gas supply source 120, and the silane-based gas supply source 121 via the distribution nozzle 125d. Through the above process, as shown in FIG. 11C, a doped amorphous silicon film 8a* including n-type impurities, that is, phosphorus (P) in the present embodiment, is formed, and the contact hole 3 is filled with the doped amorphous silicon film 8a*. In addition, if the concentration of the n-type impurities in the doped amorphous silicon film 8a* is greater than that of the n-type silicon substrate 1, the n-type impurities are dispersed toward the n-type silicon substrate 1 from the doped amorphous silicon film 8a*, for example, as shown in FIG. 11C.

As described above, the n-type impurities may be introduced onto the amorphous silicon film 8a to form the doped amorphous silicon film 8a*. In this case, the doped amorphous silicon film 8a* has less resistance, and the contact resistance may be reduced.

In addition, when the concentration of the n-type impurities in the doped amorphous silicon film 8a* is higher than that of the n-type silicon substrate 1, the n-type impurities are dispersed toward the n-type silicon substrate 1 from the doped amorphous silicon film 8a*, for example, as shown in FIG. 11C. Through the dispersion, the contact resistance on the n-type silicon substrate 1 may be reduced.

In addition, the n-type impurities may be introduced onto the contact portion of the n-type silicon substrate as described with reference to FIG. 10A, and the doped amorphous silicon film 8a* may be additionally formed according to the film formation method described with reference to FIG. 11C.

Fourth Embodiment

Figure 12:
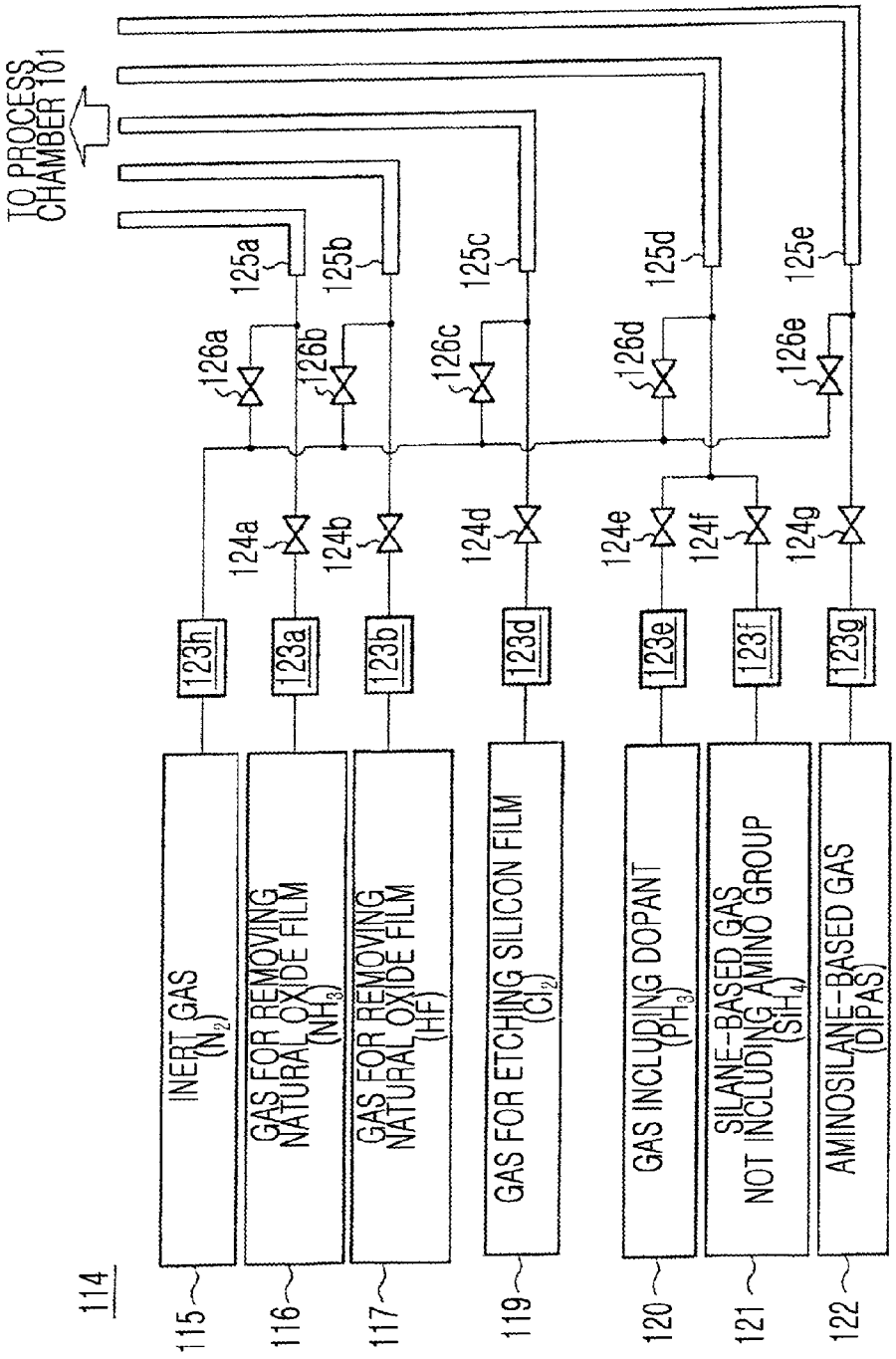
FIG. 12 is a schematic block diagram showing an example of a gas supply mechanism included in a film formation apparatus according to a fourth embodiment of the present invention.

FIG. 12 is a schematic block diagram showing an example of a gas supply mechanism 114 included in a film formation apparatus according to a fourth embodiment of the present invention.

As shown in FIG. 12, the gas supply mechanism 114 included in the film formation apparatus according to the fourth embodiment is different from the gas supply mechanism 114 included in the film formation apparatus according to the third embodiment in that a third gas supply source 119 for supplying a gas etching silicon film is additionally provided.

The third gas supply source 119 may prepare or generate the following gas for etching the silicon film in the present embodiment.

gas for etching the silicon film: Chlorine ($Cl_2$) gas

The third gas supply source 119 is connected to a distribution nozzle 125c via a flow rate controller 123d and an opening/closing valve 124d.

The distribution nozzle 125c is formed of a quartz tube, and penetrates through the side wall of the manifold 103 into the manifold 103 and then bends upward. In addition, the distribution nozzle 125c is extended into the process chamber 101 in a vertical direction, as shown in FIG. 1.

FIGS. 13A through 13E are cross-sectional views showing an example of the film formation method executable by the film formation apparatus according to the fourth embodiment of the present invention.

Figure 13A:
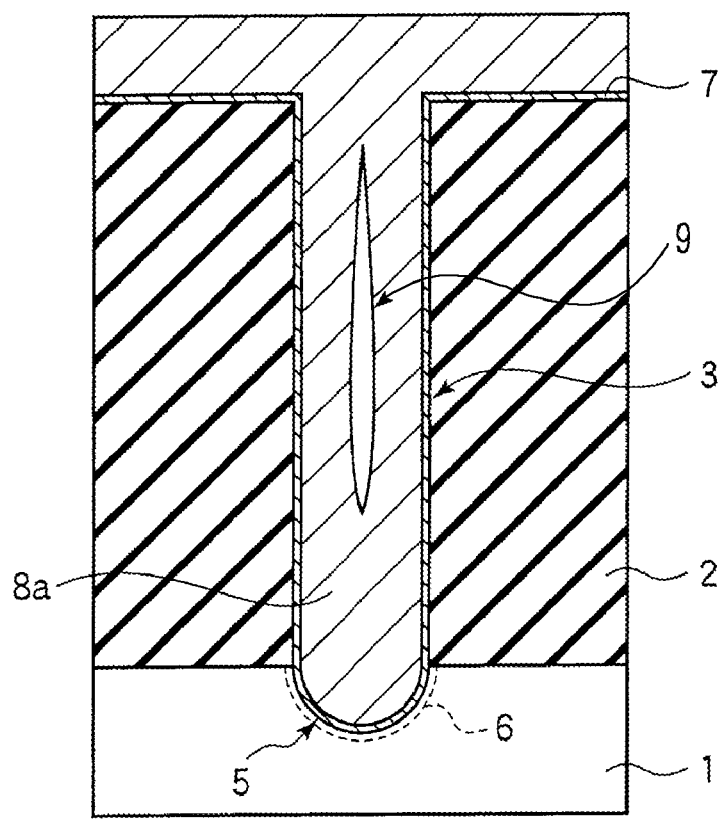
FIGS. 13A through 13E are cross-sectional views showing an example of a film formation method executable by the film formation apparatus according to the fourth embodiment of the present invention.

When the amorphous silicon film 8a is formed, the filling of the contact hole 3 may be finished. However, when an aspect ratio of the contact hole 3 is high (when the contact hole 3 is narrow and long in a longitudinal direction), a void 9 may be provided on the amorphous silicon film 8a as shown in FIG. 13A. Hereinafter, the following additional processes are performed under the assumption that the void 9 is provided on the amorphous silicon film 8a.

Figure 13B:
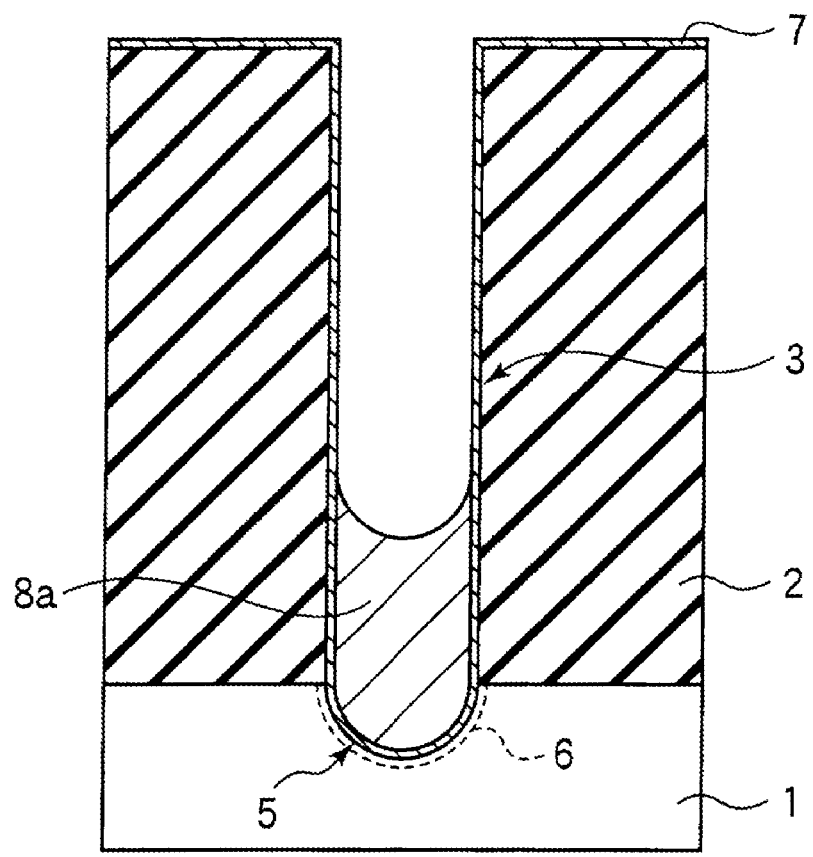

First, the temperature inside the process chamber 101 is adjusted such that the temperature of the n-type silicon substrate 1 is about 200° C. to 500° C., for example. In addition, the opening/closing valves 124d and 126c are opened so as to supply the $N_2$ gas and the $Cl_2$ gas into the process chamber 101 from the inert gas supply source 115 and the third gas supply source 119 via the distribution nozzle 125c. Through the above process, a region of the amorphous silicon film 8a reaching an intermediate portion of the contact hole 3, for example, a region of the amorphous silicon film 8a in which the void 9 is assumed to be provided, is removed, as shown in FIG. 13B. When the process is finished, the opening/closing valve 124d is closed to stop the supply of the $Cl_2$ gas, and at the same time, the atmosphere inside the process chamber 101 is purged by using the $N_2$ gas. After that, the exhauster 132 is stopped and the opening/closing valve 126c is closed to stop the supply of the $N_2$ gas.

Figure 13C:
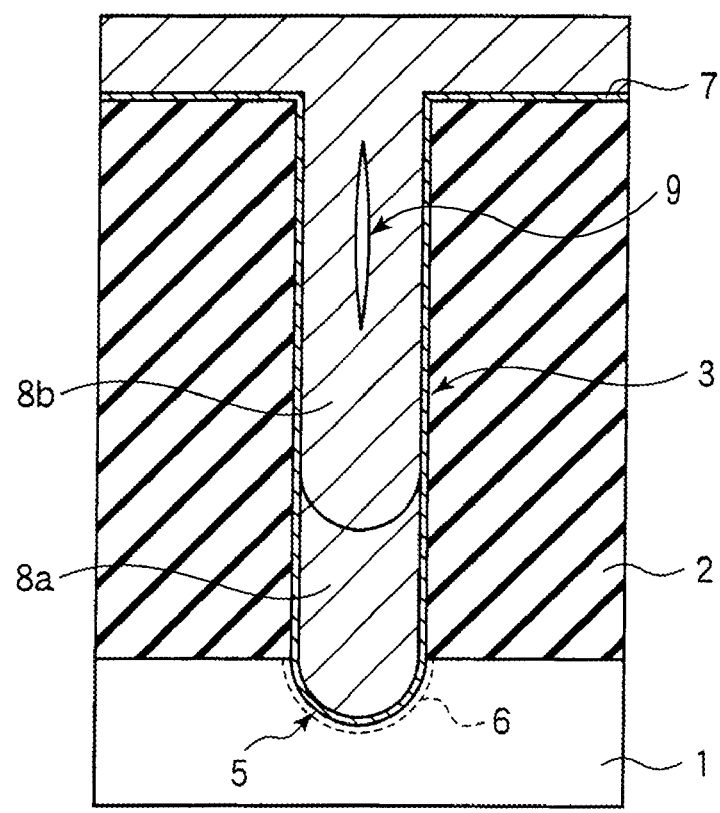

Next, the temperature inside the process chamber 101 is adjusted such that the temperature of the n-type silicon substrate 1 is about 400° C. to 650° C., for example. In addition, the opening/closing valves 124f and 126d are opened so as to supply the $N_2$ gas and the $SiH_4$ gas into the process chamber 101 from the inert gas supply source 115 and the silane-based gas supply source 121 via the distribution nozzle 125d. Through the above process, a silicon film, that is, an amorphous silicon film 8b in the present embodiment, is formed on the seed layer 7 and the amorphous silicon film 8a, and thus the contact hole 3 is filled again as shown in FIG. 13C. When the process is finished, the opening/closing valve 124f is closed to stop the supply of the $SiH_4$ gas, and the atmosphere inside the process chamber 101 is purged by using the $N_2$ gas. After that, the exhauster 132 is stopped and the opening/closing valve 126d is closed to stop the supply of the $N_2$ gas is stopped.

Figure 13D:
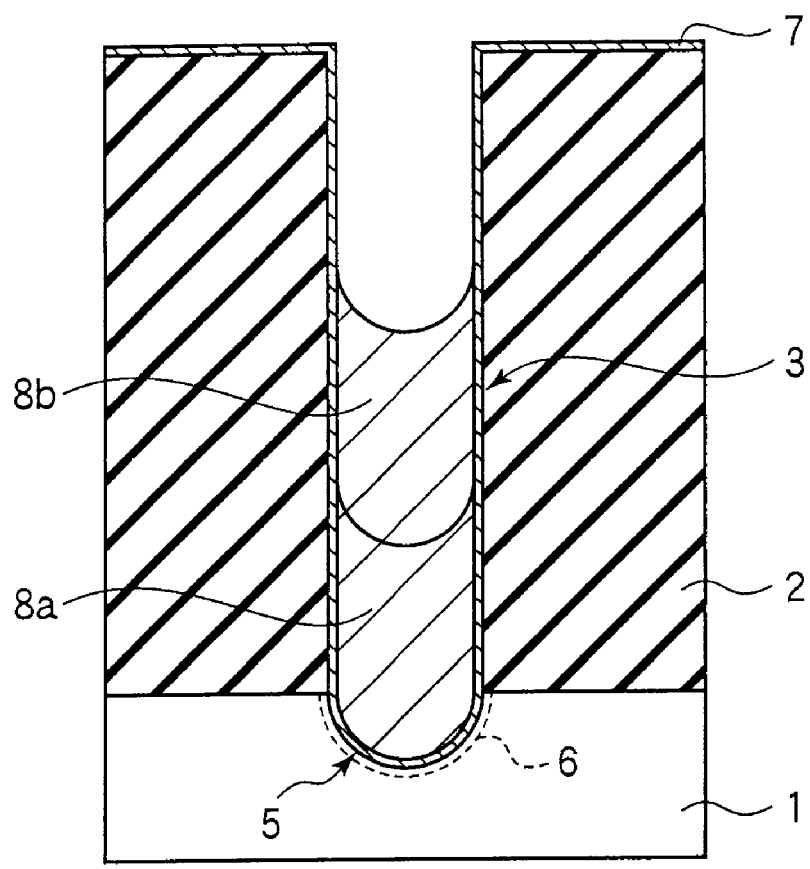
Figure 13E:
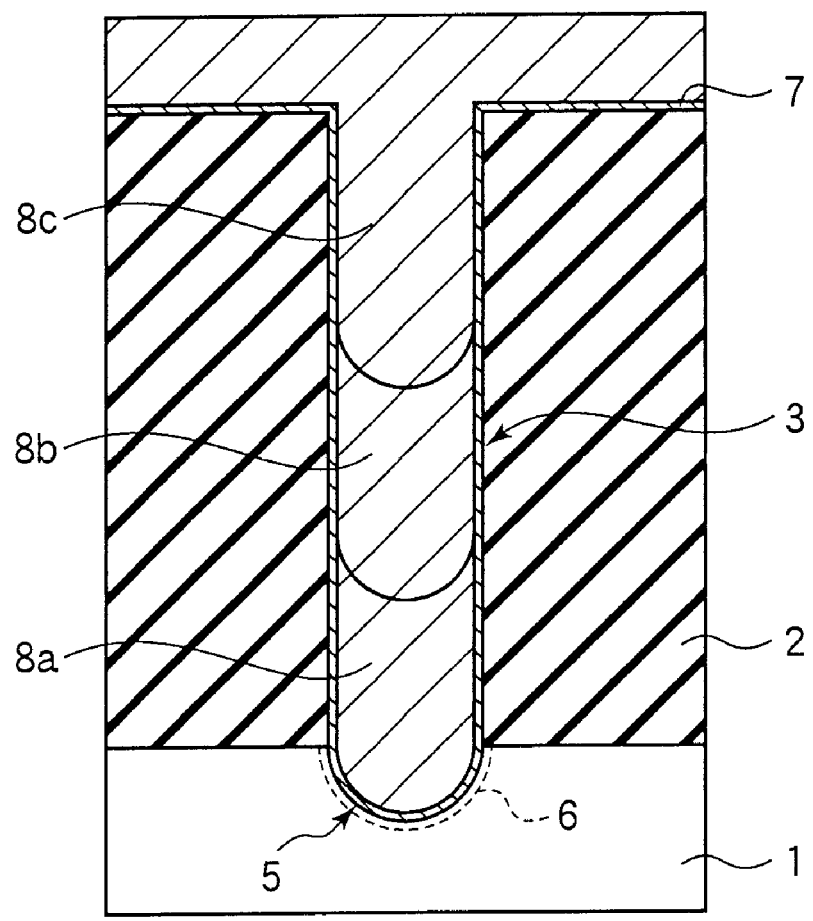

The deposition and etching operations are repeated, for example, as shown in FIGS. 13D and 13E, and thus the contact hole 3 is filled by the amorphous silicon films 8a and 8b and an amorphous silicon film 8c while removing regions, in which the void 9 is assumed to be provided, from the amorphous silicon films 8a and 8b. When the final amorphous silicon film, that is, the amorphous silicon film 8c in the present embodiment as a third layer, is formed, the n-type silicon substrate 1 is transferred from the process chamber 101.

As described above, in the film formation apparatus according to the fourth embodiment, the initial step of the filling process of the contact hole 3, that is, forming of the amorphous silicon film 8a, is performed in the same manner as that of the first embodiment. Therefore, the same effects as those of the first embodiment may be obtained.

In addition, according to the film formation apparatus of the fourth embodiment, the void 9 provided in the amorphous silicon films 8a and 8b may be removed, and thus, the increase in the contact resistance caused due to the providing of the void 9 may be prevented.

Also, the forming and etching of the amorphous silicon films 8a and 8b may be performed in the same process chamber of the film formation apparatus, and thus, there is no need to transfer substrates between devices to perform the film formation and etching processes. Therefore, deterioration of the throughput may be prevented.

Fifth Embodiment

The above described first embodiment is mainly to improve the throughput in the filling process by reducing the incubation time of the formed film.

In addition, the second through fourth embodiments are to prevent the increase in the contact resistance in the contact hole or the line that is miniaturized, as well as to improve the throughput. As described with respect to the second through fourth embodiments, in the miniaturized contact hole or line, contact resistance increases because, for example, 1) affects of an increase in resistance caused by the natural oxide film are greatly increased, 2) a surface area of a contact portion is reduced, and 3) since a volume of the conductive material that is filled is small, a volume reduction due to a void provided on a conductive material is large.

The fifth embodiment is to provide a film formation apparatus that may address the above problems 1) through 3) with one film formation apparatus, and may improve the throughput by reducing the incubation time of the formed film.

FIG. 14 is a schematic block diagram showing an example of a gas supply mechanism included in the film formation apparatus according to the fifth embodiment of the present invention.

As shown in FIG. 14, the gas supply mechanism 114 included in the film formation apparatus according to the fifth embodiment is different from the gas supply mechanism 114 included in the film formation apparatus according to the fourth embodiment in that a fourth gas supply source 118 for supplying a fourth gas that may etch a conductive substance, that is, the n-type silicon substrate 1 in the present embodiment, is additionally provided in the present embodiment.

In the present embodiment, the fourth gas supply source 118 may prepare or generate the following gas that may etch a conductive substance.

gas for etching conductive substance: fluorine ($F_2$) gas

The fourth gas supply source 118 is connected to the distribution nozzle 125c via the flow rate controller 123c and the opening/closing valve 124c.

Figure 15:
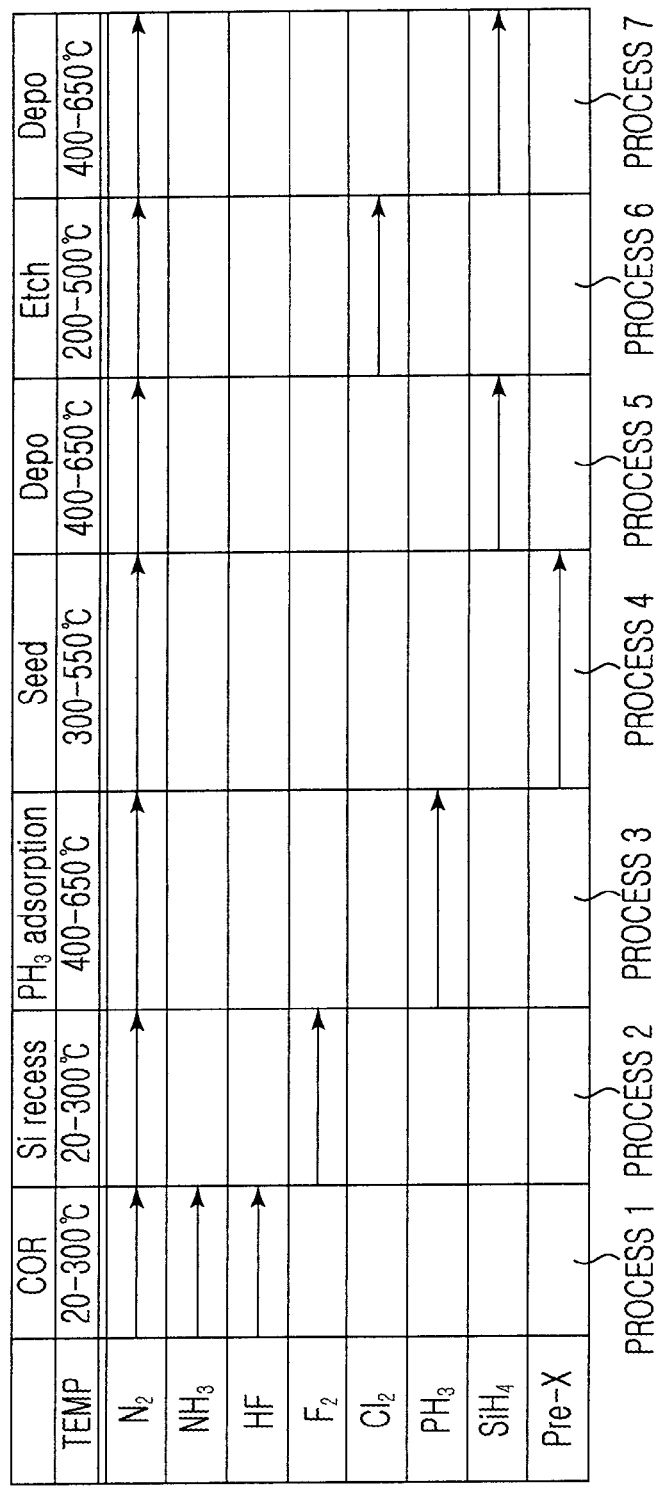
FIG. 15 is a timing chart showing an example of supply of process gases and process temperatures in a film formation method executable by the film formation apparatus according to the fifth embodiment of the present invention.

FIG. 15 is a timing chart showing examples of supply of process gases and process temperatures in a film formation method executable by a film formation apparatus according to fifth embodiment of the present invention, and FIGS. 16A through 16J are cross-sectional views showing the film formation method.

Figure 16A:
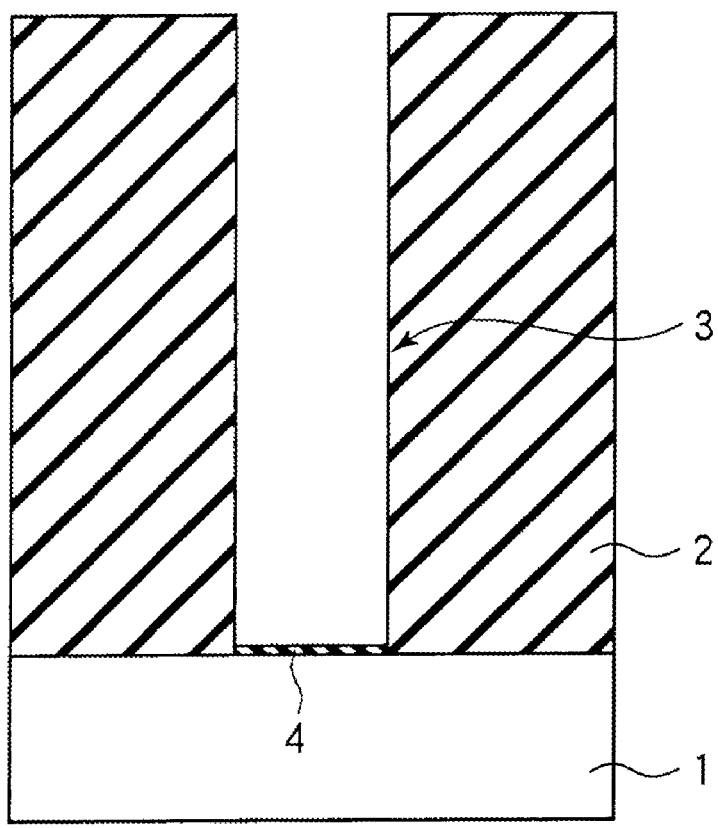
FIGS. 16A through 16J are cross-sectional views showing a film formation method executable by the film formation apparatus according to the fifth embodiment of the present invention.

First, FIG. 16A is a cross-sectional view showing that the contact hole 3 reaching the n-type silicon substrate 1 is provided on the interlayer insulation film 2 formed on the n-type silicon substrate 1.

As shown in FIG. 16A, after providing the contact hole 3, when the n-type silicon substrate 1 is transferred from a process chamber of an etching apparatus, a thin natural oxide film 4 is grown on a surface of the n-type silicon substrate 1 exposed on a bottom of the contact hole 3.

Figure 16B:
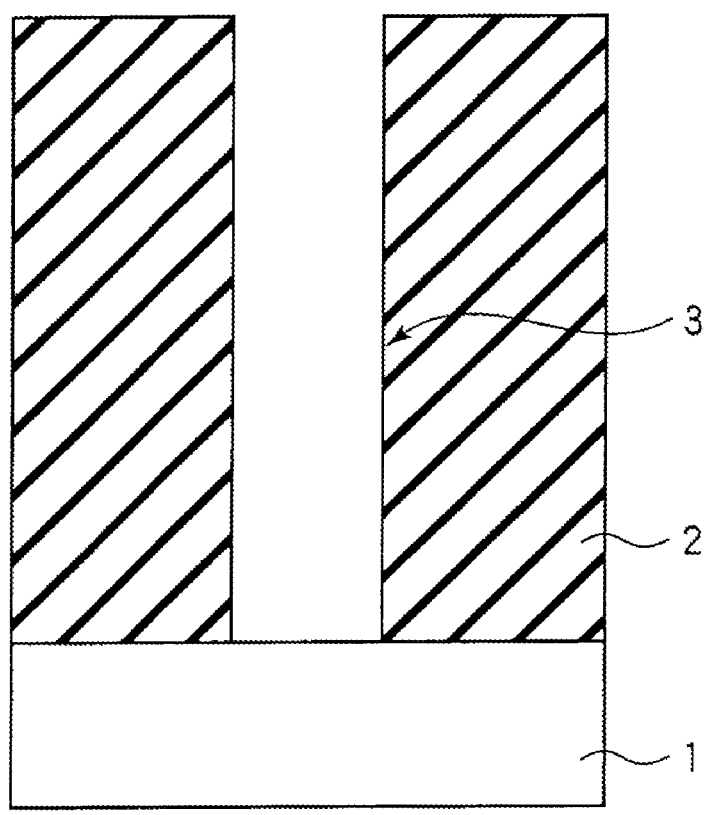

Next, the n-type silicon substrate 1 on which the natural oxide film 4 is grown is transferred to the process chamber 101 of the film formation apparatus 100 shown in FIG. 1. After the n-type silicon substrate 1 is transferred to, the heating apparatus 133 heats the process chamber 101 to a predetermined temperature. In the present embodiment, a temperature inside the process chamber 101 is adjusted such that a temperature of the n-type silicon substrate 1 is about 20° C. to 300° C. In addition, the opening/closing valves 124a, 124b, 126a, and 126b shown in FIG. 14 are opened so as to supply the nitrogen ($N_2$) gas, the ammonia ($NH_3$) gas, and the hydrogen fluoride (HF) gas into the process chamber 101 respectively from the inert gas supply source 115, the first gas supply source 116, and the second gas supply source 117 via the distribution nozzles 125a and 125b (process 1: COR shown in FIG. 15). Through the above process, the natural oxide film 4 formed on the surface of the n-type silicon substrate 1 exposed on the bottom of the contact hole 3 is removed, as shown in FIG. 16B. When the process is finished, the opening/closing valves 124a and 124b are closed to stop the supplies of the $NH_3$ gas and the HF gas. In addition, while evacuating the process chamber 101 by the exhauster 132, $N_2$ gas is supplied into the process chamber 101 to purge an atmosphere inside the process chamber 101 by using the $N_2$ gas. After that, the exhauster 132 is stopped and the opening/closing valves 126a and 126b are closed to stop the supply of the $N_2$ gas.

Figure 16C:
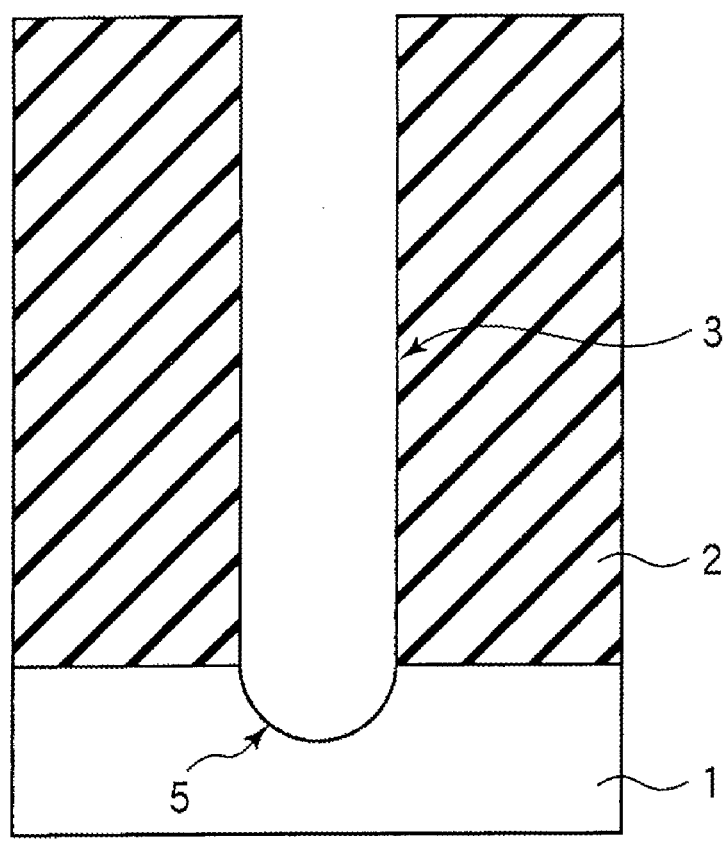

Next, like in the second embodiment, the temperature inside the process chamber 101 is adjusted such that the temperature of the n-type silicon substrate 1 is about 20° C. to 300° C., for example. In addition, the opening/closing valves 124c and 126c are opened so as to supply the $N_2$ gas and the fluorine ($F_2$) gas into the process chamber 101 from the inert gas supply source 115 and the fourth gas supply source 118 via the distribution nozzle 125c (process 2: Si recess shown in FIG. 15). Through the above process, the surface of the n-type silicon substrate 1 exposed on the bottom of the contact hole 3 is recessed as denoted by reference numeral 5, as shown in FIG. 16C. When the process is finished, the opening/closing valve 124c is closed to stop the supply of the $F_2$ gas, and at the same time, the atmosphere inside the process chamber 101 is purged by using the $N_2$ gas. After that, the exhauster 132 is stopped and the opening/closing valve 126c is closed to stop the supply of the $N_2$ gas.

Figure 16D:
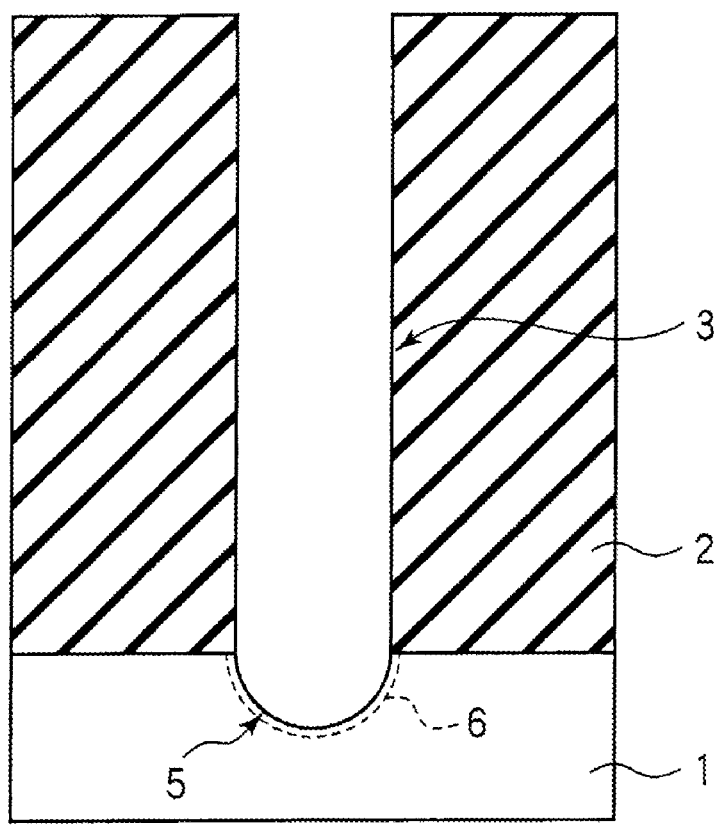

Next, like in the third embodiment, the temperature inside the process chamber 101 is adjusted such that the temperature of the n-type silicon substrate 1 is about 400° C. to 650° C., for example. In addition, the opening/closing valves 124e and 126d are opened so as to supply the $N_2$ gas and the phosphine ($PH_3$) gas into the process chamber 101 from the inert gas supply source 115 and the dopant gas supply source 120 via the distribution nozzle 125d (process 3: $PH_3$ adsorption shown in FIG. 15). Through the above process, n-type impurities, that is, phosphorous (P), are adsorbed onto the recessed surface of the n-type silicon substrate 1 as denoted by reference numeral 6, as shown in FIG. 16D, and thus a concentration of the n-type impurities on the surface of the n-type silicon substrate 1 is increased. Consequently, resistance of the surface of the n-type silicon substrate 1 is reduced. When the process is finished, the opening/closing valve 124e is closed to stop the supply of the $PH_3$ gas, and at the same time, the atmosphere inside the process chamber 101 is purged by using the $N_2$ gas. After that, the exhauster 132 is stopped and the opening/closing valve 126d is closed to stop the supply of the $N_2$ gas.

Figure 16E:
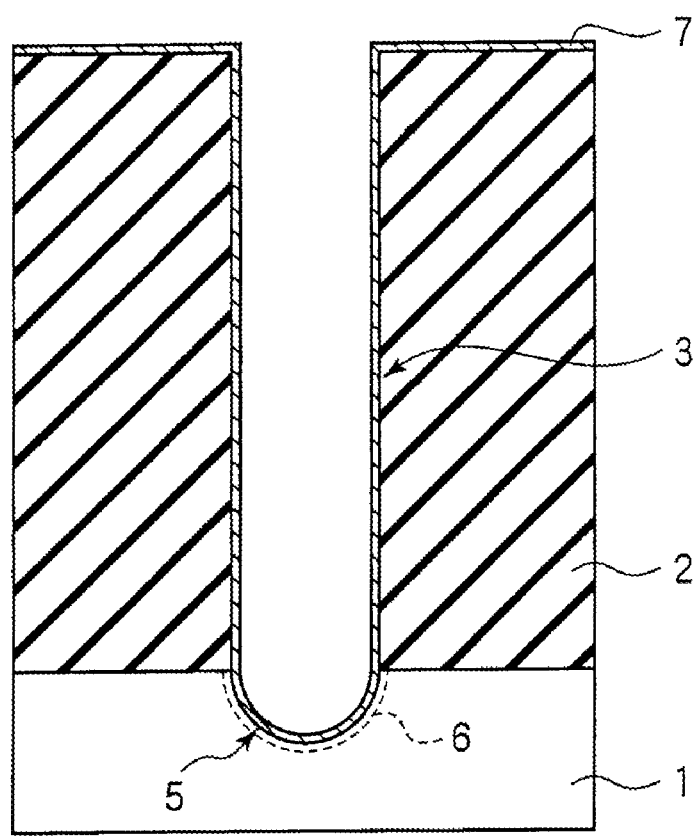

Next, like in the first embodiment, the temperature inside the process chamber 101 is adjusted such that the temperature of the n-type silicon substrate 1 is about 300° C. to 550° C., for example. In addition, the opening/closing valves 124g and 126e are opened so as to supply the $N_2$ gas and the diisopropylaminosilane (DIPAS) gas (represented as Pre-X in FIG. 15) into the process chamber 101 from the inert gas supply source 115 and the aminosilane-based gas supply source 122 via the distribution nozzle 125e (process 4: Seed shown in FIG. 15). Through the above process, a seed layer 7 is formed on the interlayer insulation film 2 and the recessed surface of the n-type silicon substrate 1 as shown in FIG. 16E. When the process is finished, the opening/closing valve 124g is closed to stop the supply of the DIPAS gas, and at the same time, the atmosphere inside the process chamber 101 is purged by using the $N_2$ gas. After that, the exhauster 132 is stopped and the opening/closing valve 126e is closed to stop the supply of the $N_2$ gas.

Figure 16F:
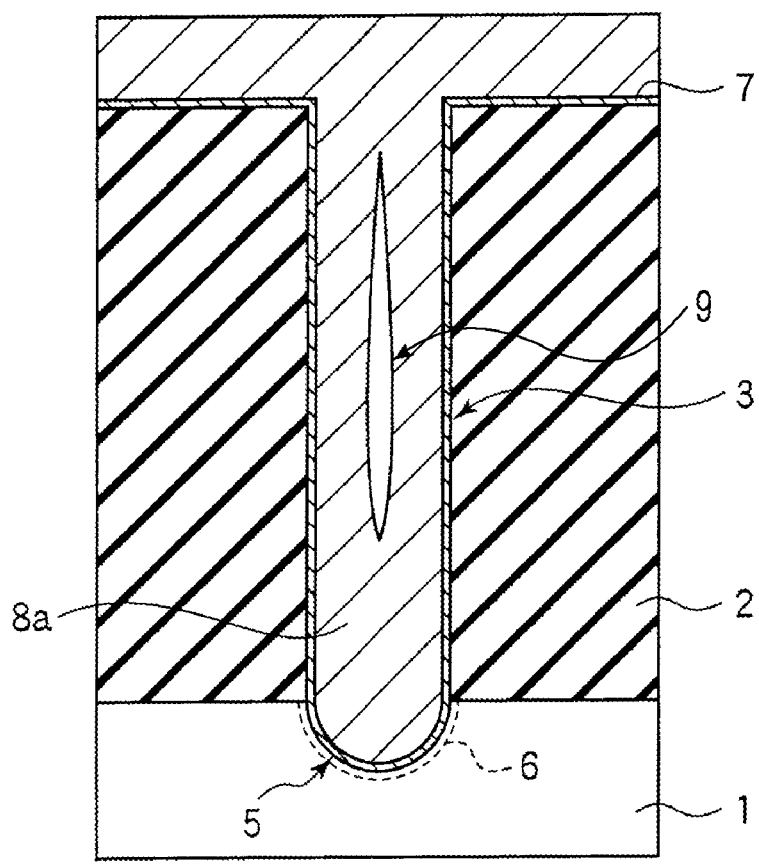

Next, the temperature inside the process chamber 101 is adjusted such that the temperature of the n-type silicon substrate 1 is about 400° C. to 650° C., for example. In addition, the opening/closing valves 124f and 126d are opened so as to supply the $N_2$ gas and the monosilane ($SiH_4$) gas into the process chamber 101 from the inert gas supply source 115 and the silane-based gas supply source 121 via the distribution nozzle 125d (process 5: Depo shown in FIG. 15). Through the above process, a silicon film, that is, an amorphous silicon film 8a in the present embodiment, is formed on the seed layer 7 to fill the contact hole 3, as shown in FIG. 16F. When the process is finished, the opening/closing valve 124f is closed to stop the supply of the $SiH_4$ gas, and at the same time, the atmosphere inside the process chamber 101 is purged by using the $N_2$ gas. After that, the exhauster 132 is stopped and the opening/closing valve 126d is closed to stop the supply of the $N_2$ gas.

In addition, in the present embodiment, a dopant may be introduced onto the amorphous silicon film 8a from the dopant gas supply source 120 via the distribution nozzle 125d so as to form the doped amorphous silicon film 8a*, like in the modified example of the third embodiment.

In addition, in the present embodiment, the filling of the contact hole 3 may be finished at a stage where the amorphous silicon film 8a is formed. However, as described in the fourth embodiment, the film formation and etching operations are repeated, and thus the film may be formed while removing regions in which the void 9 is assumed to be provided, from the amorphous silicon film 8a. Hereinafter, the following additional processes are performed under the assumption that the void 9 is provided in the present embodiment.

Figure 16G:
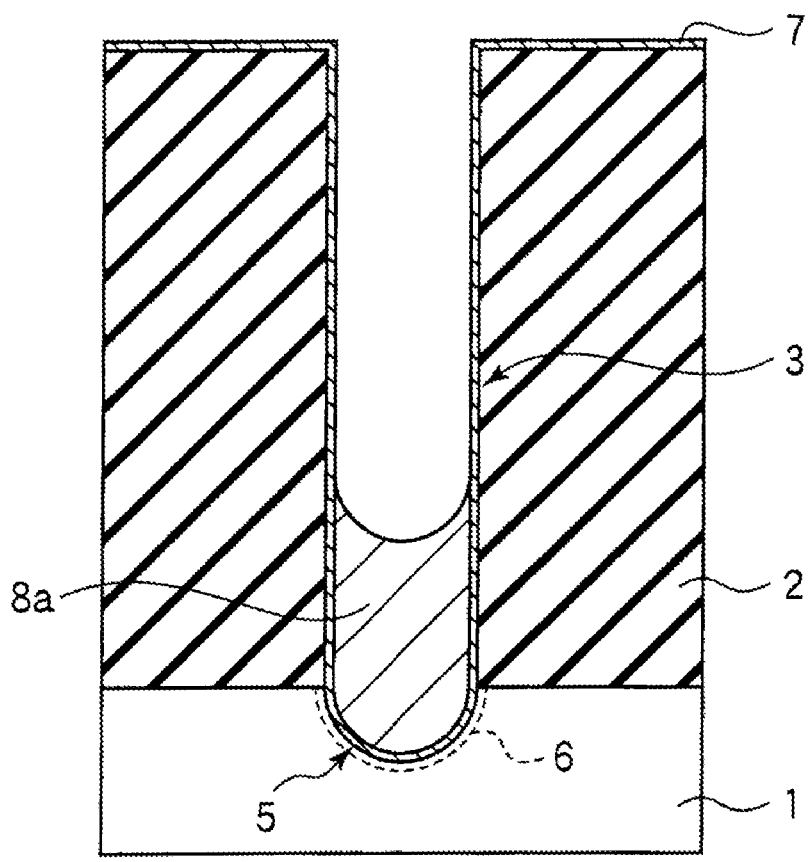

Like in the fourth embodiment, the temperature inside the process chamber 101 is adjusted such that the temperature of the n-type silicon substrate 1 is about 200° C. to 500° C., for example. In addition, the opening/closing valves 124d and 126c are opened so as to supply the $N_2$ gas and the chlorine ($Cl_2$) gas into the process chamber 101 from the inert gas supply source 115 and the third gas supply source 119 via the distribution nozzle 125c (process 6: Etch shown in FIG. 15). Through the above process, as shown in FIG. 16G, a region of the amorphous silicon film 8a reaching an intermediate portion of the contact hole 3, for example, a region of the amorphous silicon film 8a in which the void 9 is assumed to be provided, is removed. When the process is finished, the opening/closing valve 124d is closed to stop the supply of the $Cl_2$ gas, and at the same time, the atmosphere inside the process chamber 101 is purged by using the $N_2$ gas. After that, the exhauster 132 is stopped and the opening/closing valve 126c is closed to stop the supply of the $N_2$ gas.

Figure 16H:
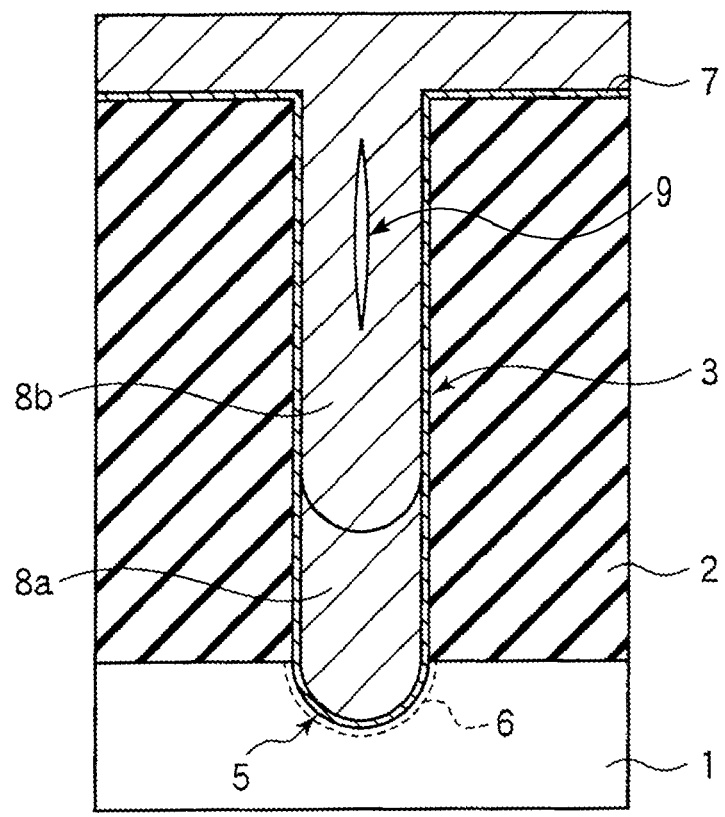

Next, the temperature inside the process chamber 101 is adjusted such that the temperature of the n-type silicon substrate 1 is about 400° C. to 650° C., for example. In addition, the opening/closing valves 124f and 126d are opened so as to supply the $N_2$ gas and the $SiH_4$ gas into the process chamber 101 from the inert gas supply source 115 and the silane-based gas supply source 121 via the distribution nozzle 125d (process 7: Depo shown in FIG. 15). Through the above process, a silicon film, that is, an amorphous silicon film 8b in the present embodiment, is formed on the seed layer 7 and the amorphous silicon film 8a, and thus the contact hole 3 is filled again, as shown in FIG. 16H. When the process is finished, the opening/closing valve 124f is closed to stop the supply of the $SiH_4$ gas, and at the same time, the atmosphere inside the process chamber 101 is purged by using the $N_2$ gas. After that, the exhauster 132 is stopped and the opening/closing valve 126d is closed, and then the supply of the $N_2$ gas is stopped.

Figure 16I:
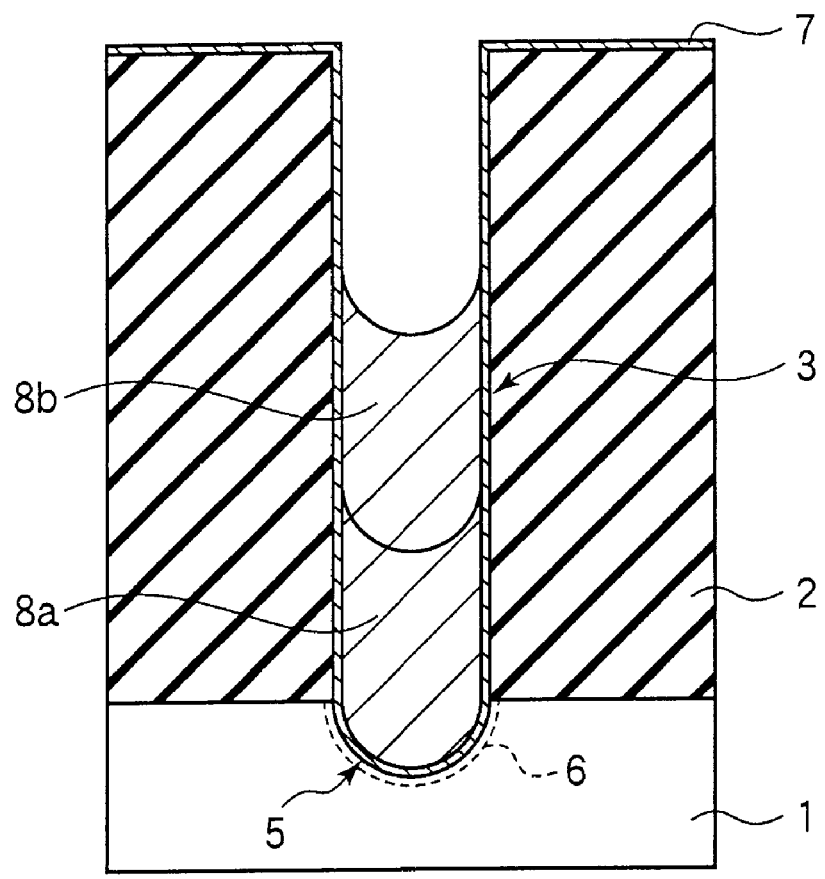
Figure 16J:
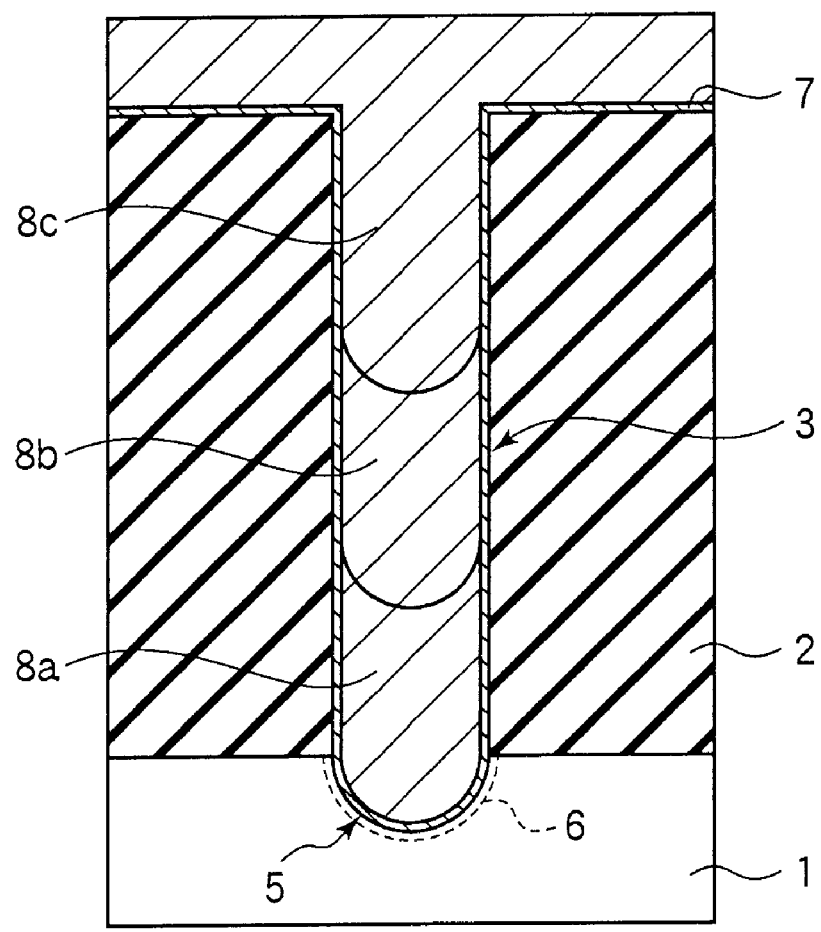

The deposition and etching operations are repeated, for example, as shown in FIGS. 16I and 16J, and thus the contact hole 3 is filled by the amorphous silicon films 8a and 8b and an amorphous silicon film 8c while removing regions in which the void 9 is assumed to be provided, from the amorphous silicon films 8a and 8b. When the final amorphous silicon film, that is, the amorphous silicon film 8c in the present embodiment, is formed as a third layer, the n-type silicon substrate 1 is transferred from the process chamber 101.

In addition, like in the modified example of the third embodiment, the amorphous silicon films 8b and 8c may be formed as doped amorphous silicon films.

As described above, the film formation method using the film formation apparatus according to the fifth embodiment, that is, the filling process of the contact hole 3, is finished.

According to the film formation apparatus of the fifth embodiment, even when the contact hole is miniaturized, (1) in the process 1, the natural oxide film 4 is removed from the surface of the n-type silicon substrate 1 exposed on the bottom of the contact hole 3. Thus, an increase in contact resistance caused by the natural oxide film 4 may be prevented.

(2) In the process 2, the surface of the n-type silicon substrate 1 exposed on the bottom of the contact hole 3 is recessed. Thus, a surface area of a contact portion is greater than that in a case where the exposed surface of the n-type silicon substrate 1 is not recessed, and thus an increase in the contact resistance caused by a reduced surface area of the contact portion may be prevented.

(3) While maintaining the above advantages (1) and (2), the seed layer 7 is formed by using the aminosilane-based gas in the process 4. Thus, the incubation time of the amorphous silicon film 8a formed by using the silane-based gas in the process 5 may be reduced.

Moreover, the above advantages (1) through (3) may be obtained by performing the method using only one film formation apparatus 100.

In addition, in the fifth embodiment, (4) in the processes 6 and 7, the deposition and etching of the amorphous silicon film are repeated, and then the void provided in the deposited amorphous silicon film is removed. Thus, the volume reduction of the amorphous silicon film filled in the contact hole 3 caused by the void may be prevented, and thus an increase in the contact resistance caused by the volume reduction may be prevented.

In addition, according to the fifth embodiment of the present invention, (5) in the process 3, the n-type impurities, that is, phosphorous (P), is adsorbed onto the recessed surface of the n-type silicon substrate 1. Accordingly, the concentration of the n-type impurities on the surface portion of the n-type silicon substrate 1 may be increased, and thus, the resistance on the surface of the n-type silicon substrate 1 may be reduced.

The above advantages (4) and (5) may be also obtained by performing the method using only one film formation apparatus 100, with the advantages (1) through (3).

Therefore, according to the film formation apparatus of the fifth embodiment, the film formation may prevent or reduce the increase in the contact resistance even in the contact hole that is miniaturized, and the incubation time of the formed film is short and thus a film formation apparatus that may improve a throughput is provided.

While this invention has been particularly shown and described with reference to the first through fifth embodiments thereof, the present invention may be variously modified and is not limited to the above first through fifth embodiments.

For example, in the fifth embodiment, after etching the amorphous silicon film 8a in the process 6, the amorphous silicon film 8b is formed by using the silane-based gas not including an amino group in the process 7.

Instead, the amorphous silicon film 8a is removed to an intermediate portion of the contact hole 3, and after that, the aminosilane-based gas is supplied into the process chamber 101 again so that a new seed layer is formed on the interlayer insulation film 2 and the surface of the amorphous silicon film 8a. After that, the silane-based gas not including an amino group is supplied into the process chamber 101 again so that the amorphous silicon film 8b may be formed on the new seed layer.

In addition, in the fifth embodiment, the film formation apparatus 100 is applied to the filling process of the contact hole 3 reaching the n-type silicon substrate 1.

However, the present invention is not limited to the filling process of the contact hole 3, and may be applied to a filling process of recessed lines with the above advantages.

In addition, the contact hole 3 may reach a p-type silicon substrate, or an active region such as a source region or a drain region provided on the n-type or p-type silicon substrate, or a well, as well as the n-type silicon substrate 1. In addition, the contact hole 3 may reach a metal wire such as copper, as well as a semiconductor region. When the contact hole 3 reaches a region besides a semiconductor region such as a metal wire, the process 3 of FIG. 15, that is, the dopant adsorption process, may be omitted.

In the above first through fifth embodiments, the DIPAS gas is used as the aminosilane-based gas; however, following aminosilane-based gases in addition to the DIPAS gas may be used as the aminosilane-based gas.

Butylaminosilane (BAS),
Bistertiarybutylaminosilane (BTBAS),
Dimethylaminosilane (DMAS),
Bisdimethylaminosilane (BDMAS),
Tris(dimethylamino) silane (TDMAS),
Diethylaminosilane (DEAS),
Bis(diethylamino) silane (BDEAS), and
Dipropylaminosilane (DPAS).

In addition, in the above embodiment, the monosilane gas ($SiH_4$) gas is used as the silane-based gas not including an amino group; however, following silane-based gases that do not include an amino-group may be used besides the $SiH_4$ gas.

$SiH_6$,
$Si_2H_4$,
$Si_2H_6$,

A hydride of silicon represented by $Si_mH_{2m+2}$, where m is a natural number equal to 3 or greater, and A hydride of silicon represented by $Si_nH_{2n}$, where n is a natural number equal to 3 or greater.

The hydride of silicon represented by the $Si_mH_{2m+2}$, where m is a natural number equal to 3 or greater, may be at least one of:

trisilane ($Si_3H_8$),
tetrasilane ($Si_4H_{10}$),
pentasilane ($Si_5H_{12}$),
hexasilane ($Si_6H_{14}$), and
heptasilane ($Si_7H_{16}$).

In addition, the hydride of silicon represented by the $Si_nH_{2n}$, where n is a natural number equal to 3 or greater, may be at least one of:

cyclotrisilane ($Si_3H_6$),
cyclotetrasilane ($Si_4H_8$),
cyclopentasilane ($Si_5H_{10}$),
cyclohexasilane ($Si_6H_{12}$), and
cycloheptasilane ($Si_7H_{14}$).

In addition, components may be omitted in the third through fifth embodiments.

For example, the first gas supply source 116 and the second gas supply source 117 may be omitted from the gas supply mechanism 114 shown in FIG. 9 according to the third embodiment.

In addition, at least one of the first gas supply source 116, the second gas supply source 117, and the dopant gas supply source 120 may be omitted from the gas supply mechanism 114 shown in FIG. 12 according to the fourth embodiment.

In addition, at least one of the first gas supply source 116, the second gas supply source 117, the third gas supply source 119, and the dopant gas supply source 120 may be omitted from the gas supply mechanism 114 shown in FIG. 14 according to the fifth embodiment.

According to the present invention, since the throughput of the filling process may be improved, the film formation apparatus has an excellent production capability with respect to the semiconductor integrated circuit device in which the filling processes are frequently used.

Besides, the present invention may be modified variously without departing from the scope of the invention.

What is claimed is:

1. A film formation apparatus comprising:
    a process chamber which holds an object to be processed having an insulation film provided on a conductive substance, the insulation film having an opening reaching the conductive substance;
    a gas supply mechanism which is provided in the process chamber and supplies an aminosilane-based gas, and a silane-based gas that does not include an amino group; and
    a controller which is configured to control the gas supply mechanism such that a process of 1) and a process of 2) are performed sequentially in the process chamber,
    wherein the process of 1) forms a seed layer on a surface of the insulation film having the opening reaching the conductive substance and on a bottom surface of the opening by supplying the aminosilane-based gas into the process chamber, and the process of 2) forms a silicon film on the seed layer by supplying the silane-based gas that does not include the amino group into the process chamber.

2. The film formation apparatus of claim 1, further comprising a first gas supply mechanism for supplying a first gas for removing a natural oxide film formed on the conductive substance,
    wherein the controller is further configured to control the first gas supply mechanism such that a process of 3) is performed additionally in the process chamber,
    wherein the process of 3) removes the natural oxide film formed on a surface of the conductive substance exposed on a bottom of the opening by supplying the first gas into the process chamber in which the object to be processed is held.

3. The film formation apparatus of claim 1, further comprising a second gas supply mechanism for supplying a second gas for etching the conductive substance into the process chamber,
    wherein the controller is further configured to control the second gas supply mechanism such that a process of 4) is performed additionally in the process chamber,
    wherein the process of 4) recesses a surface of the conductive substance exposed on a bottom of the opening by supplying the second gas into the process chamber.

4. The film formation apparatus of claim 1, further comprising a third gas supply mechanism for supplying a third gas for etching the silicon film into the process chamber,
    wherein the controller is further configured to control the third gas supply mechanism such that a process of 5) and a process of 6) are performed repeatedly until the opening is filled by the silicon film and a new silicon film after the process of 2),
    wherein the process of 5) removes the silicon film to an intermediate portion of the opening by supplying the third gas into the process chamber, and the process of 6) forms the new silicon film on the silicon film by supplying the silane-based gas that does not include an amino group into the process chamber again.

5. The film formation apparatus of claim 1, further comprising a fourth gas supply mechanism for supplying a fourth gas for etching the silicon film into the process chamber,
    wherein the controller is further configured to control the fourth gas supply mechanism such that a process of 7), a process of 8) and a process of 9) are performed repeatedly until the opening is filled by the silicon film and a new silicon film after the process of 2), wherein the process of 7) removes the silicon film to an intermediate portion of the opening by supplying the fourth gas into the process chamber;

the process of 8) forms a new seed layer on the insulation film and a surface of the silicon film by supplying the aminosilane-based gas into the process chamber again; and the process of 9) forms the new silicon film on the new seed layer by supplying the silane-based gas that does not include an amino group into the process chamber again.

6. The film formation apparatus of claim 4, further comprising a fifth gas supply mechanism for supplying a fifth gas including a dopant material of a semiconductor into the process chamber, wherein the controller is further configured to control the fifth gas supply mechanism such that a process of 10) and/or a process of 11) are/is performed in the process chamber, when the conductive substance is a semiconductor, wherein the process of 10) reduces a resistance on a surface of the semiconductor by supplying the fifth gas into the process chamber, and the process of 11) introduces the dopant onto at least one of the silicon film and the new silicon film by supplying the fifth gas into the process chamber.

7. The film formation apparatus of claim 1, wherein the aminosilane-based gas is at least one selected from the group consisting of butylaminosilane (BAS), bistertiarybutylaminosilane (BTBAS), dimethylaminosilane (DMAS), bisdimethylaminosilane (BDMAS), tris(dimethylamino)silane (TDMAS), diethylaminosilane (DEAS), bis(diethylamino)silane (BDEAS), dipropylaminosilane (DPAS), and diisopropylaminosilane (DIPAS), and the silane-based gas that does not include an amino group is at least one selected from the group consisting of $SiH_4$, $SiH_6$, $Si_2H_4$, $Si_2H_6$, a hydride of silicon represented by $Si_mH_{2m+2}$, where m is a natural number equal to 3 or greater, and a hydride of silicon represented by $Si_nH_{2n}$, where n is a natural number equal to 3 or greater.

8. The film formation apparatus of claim 7, wherein the hydride of silicon represented by the formula $Si_mH_{2m+2}$, where m is a natural number equal to 3 or greater, is at least one selected from the group consisting of trisilane ($Si_3H_8$), tetrasilane ($Si_4H_{10}$), pentasilane ($Si_5H_{12}$), hexasilane ($Si_6H_{14}$), and heptasilane ($Si_7H_{16}$), and the hydride of silicon represented by the formula $Si_nH_{2n}$, where n is a natural number equal to 3 or greater, is at least one selected from the group consisting of cyclotrisilane ($Si_3H_6$), cyclotetrasilane ($Si_4H_8$), cyclopentasilane ($Si_5H_{10}$), cyclohexasilane ($Si_6H_{12}$), and cycloheptasilane ($Si_7H_{14}$).

* * * * *